United States Patent [19]
Moodera et al.

[11] Patent Number: 5,835,314
[45] Date of Patent: *Nov. 10, 1998

[54] TUNNEL JUNCTION DEVICE FOR STORAGE AND SWITCHING OF SIGNALS

[75] Inventors: Jagadeesh S. Moodera; Janusz Nowak, both of Somerville; Lisa Kinder, Boston; Patrick LeClair, Cambridge, all of Mass.

[73] Assignee: Massachusetts Institute of Technology, Cambridge, Mass.

[ * ] Notice: The term of this patent shall not extend beyond the expiration date of Pat. No. 5,629,922.

[21] Appl. No.: 747,152

[22] Filed: Nov. 8, 1996

Related U.S. Application Data

[60] Provisional application No. 60/015,798, Apr. 17, 1996.
[51] Int. Cl.⁶ .............................. G11B 5/39; G11C 11/00
[52] U.S. Cl. ........................... 360/113; 257/421; 365/158
[58] Field of Search .................... 360/113; 257/421–427; 365/129, 157, 158, 48, 63, 147, 173

[56] References Cited

U.S. PATENT DOCUMENTS

| | | | |
|---|---|---|---|
| 4,853,810 | 8/1989 | Pohl et al. ............................... | 360/103 |
| 5,390,061 | 2/1995 | Nakatani et al. ....................... | 361/113 |
| 5,416,353 | 5/1995 | Kamiguchi et al. .................... | 257/421 |
| 5,422,571 | 6/1995 | Gurney et al. .......................... | 324/252 |
| 5,432,373 | 7/1995 | Johnson ................................. | 257/421 |
| 5,477,482 | 12/1995 | Prinz ....................................... | 365/129 |
| 5,500,633 | 3/1996 | Saito et al. ............................... | 338/32 |

FOREIGN PATENT DOCUMENTS

WO 95/10123   4/1995   WIPO .

OTHER PUBLICATIONS

Moodera, J.S., et al., "Geometrically Enhanced Magnetoresistance in Ferromagnet–Insulator–Ferromagnet Tunnel Junctions," *Appl. Phys. Lett.*, 69(5) : 708–710 (Jul. 29, 1996).

Terunobu, M., et al., "Magnetoresistance Element," Japan Publication No. 08 070149 A (Mitsubishi Materials Corp.), published Mar. 12, 1996, from *Patent Abstracts of Japan*, 96(007) (Jul. 31,1996).

Moodera, J. S. and Kinder, L. R., "Ferromagnetic–Insulator–Ferromagnetic Tunneling: Spin–Dependent Tunneling and Large Magnetoresistance in Trilayer Junctions (Invited)," *J. Appl. Phys.* 79, pp. 4724–4729 (15 Apr. 1996).

Miyazaki, T. and Tezuka, N., "Giant Magnetic Tunneling Effect in Fe/Al$_2$O$_3$/Fe Junction," *J. Magnetism and Magnetic Materials 139*, pp. L231–L234 (1995).

Moodera, J. S., et al., "Large Magnetoresistance at Room Temperature in Ferromagnetic Thin Film Tunnel Junctions, "*Physical Review Letters 74*, pp. 3273–3276.

Meservey, R. and Tedrow, P.M., "Spin–Polarized Electron Tunneling,"*Physics Reports 238*, pp. 173–243 (1994).

(List continued on next page.)

*Primary Examiner*—A. J. Heinz
*Attorney, Agent, or Firm*—Hamilton, Brook, Smith & Reynolds, P.C.

[57] ABSTRACT

Ferromagnetic-insulator-ferromagnetic trilayer junctions show magnetoresistance (JMR) effects ranging from about 16% to several hundred percent at room temperature. Larger effects are observed when the actual tunneling resistance ($R_T$) is comparable to electrode film resistance ($R_L$) over the junction area in cross-geometry junction measurements. The geometrically enhanced large JMR can be qualitatively explained by the nonuniform current flow over the function area when $R_T$ is comparable to $R_L$, in the cross-geometry junction structure. For a fixed junction area, the effective junction resistance ($R_J$) can be varied from less than 1 ohm to several kilohms by controlling the thickness of the insulating layer or by appropriately selecting ferromagnetic films. The trilayer tunnel junctions of the present invention are nonvolatile, stable and are reproducible.

53 Claims, 14 Drawing Sheets

OTHER PUBLICATIONS

Yaoi, T., et al., "Dependence of Magnetoresistance on Temperature and Applied Voltage in a 82Ni–Fe/Al–Al$_2$O$_c$/Co Tunneling Junction," *J. Magnetism and Magnetic Materials 126*, pp. 430–432 (1993).

Slonczewski, J. C., "Conductance and Exchange Coupling of Two Ferromagnets Separated by a Tunneling Barrier," *Physical Review B 39*, pp. 6995–7002 (1 Apr. 1989).

Gibson, G. A. and Meservey, R., "Properties of Amorphous Germanium tunnel Barriers," *J. Appl. Phys. 58*, pp. 1584–1596 (15 Aug. 1985).

Meservey, R. and Tedrow, P. M., "Tunneling Characteristics of Amorphous Si Barriers," *J. Appl. Phys. 53*, pp. 1563–1570 (1982, Mar.).

Julliere, M., "Tunneling Between Ferromagnetic Films," *Physics Letters 54A*, pp. 225–226 (8 Sep. 1975).

Tedrow, P. M. and Meservey, R., "Spin–Dependent Tunneling into Ferromagnetic Nickel," *Physical Review Letters 26*, pp. 192–195 (25 Jan. 1971).

Meservey, R., et al., "Magnetic Field Splitting of the Quasiparticle States in Superconducting Aluminum Films," *Physical Review Letters 25*, pp. 1270–1272 (2 Nov. 1970).

Pedersen R. J. and Vernon, F. L., Jr., "Effect of Film Resistance on Low–Impedance Tunneling Measurements," *Applied Physics Letters 10*, pp. 29–31 (1 Jan. 1967).

Maekawa, S. and Gafvert, U., "Electron Tunneling Between Ferromagnetic Films," *IEEE Transactions on Magnetics, MAG–18* (2) : 707–708 (1982).

Miyazaki, t. et al., "Large Magnetoresistance Effect in 82Ni–Fe/Al–Al$_2$–O$_3$/Co Magnetic Tunneling Junction," *Journal of magnetism and Magnetic Materials, 98*:L7–L9 (1991).

Slonczewski, J.C., "Magnetic Bubble Tunnel Detector," *IBM Technical Disclosure Bulletin*, 19(6):2328–2336 (1976).

N. Tezuka, Y. Ando and T. Miyazaki, "Magnetic Tunneling Effect in Ferromagnet/Al$_2$O$_3$Ferromagnet Junctions," *J. of Magn. Soc. Jpn.* 19(2) : 369–372 (1995).

T. S. Plaskett et al., "Magnetoresistance and Magnetic properties of NiFe/oxide/Co Junctions Prepared by Magnetron Sputtering," *J. Appl. Phys. 76:* 6104 (1994).

T. Yaoi et al., "Magnetoresistance in 82Ni–Fe/Al$_2$O$_3$/Co Junction, Dependence of the Tunneling Conductance on the Angle between the Magnetizations of Two Ferromagnetic Layers," *J. Of Magn. Soc. Jpn.* 16: 303–308 (1992).

U.S. Patent Application Serial No. 08/407,761 filed Mar. 21, 1995 by Jagadeesh S. Moodera, Terrilyn Wong, Lisa Kinder and Robert H. Meservey entitled "Electron Tunneling Device Using Ferromagnetic Thin Films", (Copy not submitted).

Possible Device Geometries

☒ = Bottom electrode
☐ = Top electrode
(barrier is not shown)

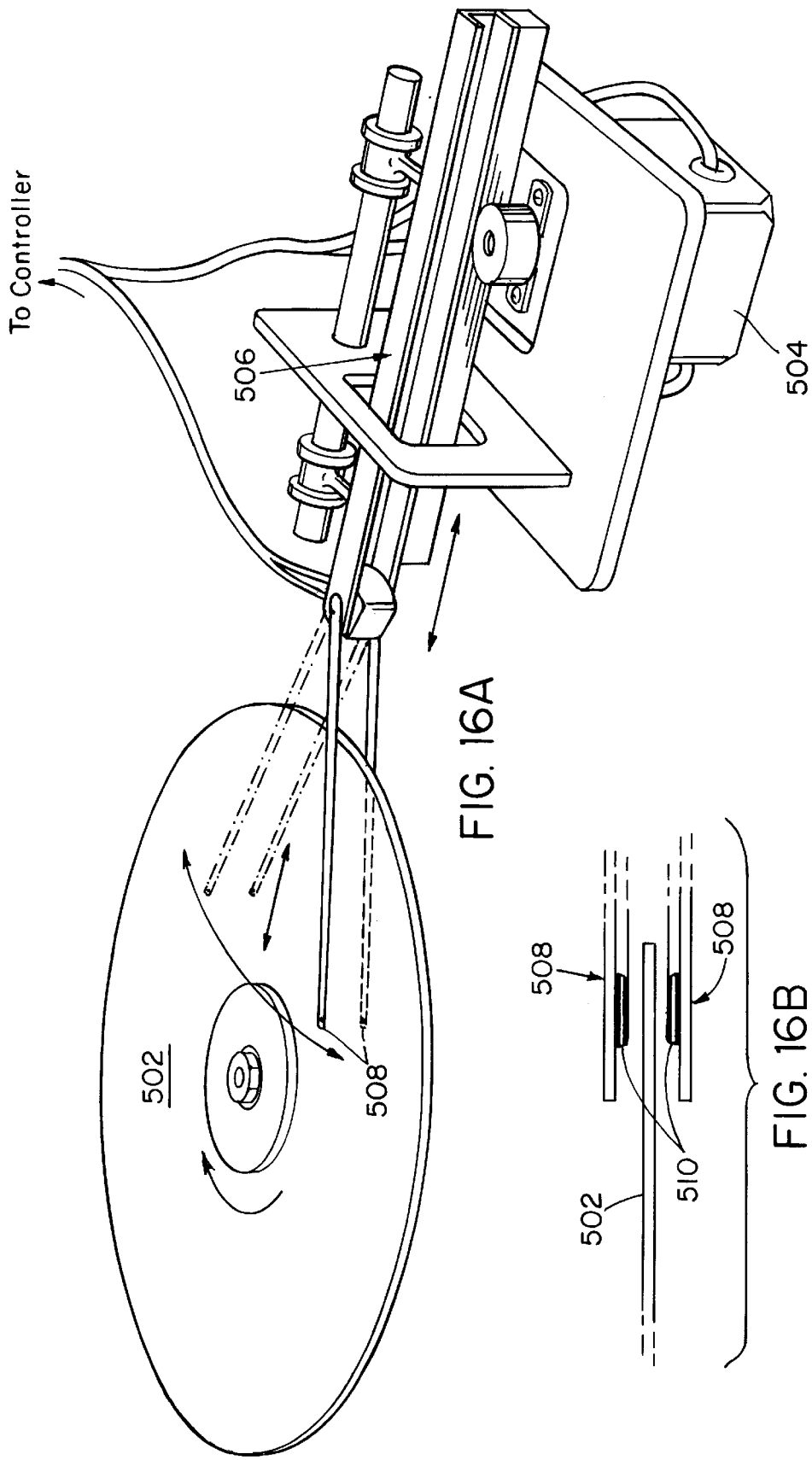

TUNNEL JUNCTION DEVICE FOR STORAGE AND SWITCHING OF SIGNALS

GOVERNMENT FUNDING

This invention was made with Government support under Contract Nos. N00014-92-J-1847 and DMR-9423013 awarded by the Office of Naval Research and the National Science Foundation, respectively. The Government has certain rights in the invention.

RELATED APPLICATIONS

This application claims priority to U.S. Provisional Application No. 60/015,798 filed on Apr. 17, 1996, the teachings of which are incorporated herein by reference in their entirety.

BACKGROUND OF THE INVENTION

Electron tunneling is a quantum phenomenon in which electric current can pass from one electrode through a thin insulating barrier layer into a second electrode. This three layer system of electrode, barrier and counter-electrode is referred to as a trilayer tunnel junction device. Where the electrodes are made of ferromagnetic material, a ferromagnet-insulator-ferromagnet (FM-I-FM) trilayer tunnel junction is formed. The intervening thin insulating layer is known as "tunnel barrier". The current flowing through a tunnel junction varies in accordance with the relative magnetization (M) direction of the FM electrodes which affects the resistance of the junction. The junction resistance increases when the magnetization of one FM becomes antiparallel to that of the other FM and decreases when they become parallel to one another.

Change in resistance of a magnetic material due to applied magnetic field is referred to as "magnetoresistance." For resistance change in a tunnel junction, the term "junction magnetoresistance" (JMR) is used, and is typically expressed in percent-ratio.

Julliere, Phys. Lett. 54A, 225 (1975), proposed an explanation for the change in junction resistance with change in magnetization direction. The explanation given in the article is based on the conduction electron spin polarization values of the FM electrodes. According to this model, the ratio of the change in the tunnel junction resistance to a peak tunnel junction resistance is given by:

$$\Delta R/R = (R_a - R_p)/R_a = (G_p - G_a)/G_p = 2P_1 P_2/(1 + P_1 P_2) \quad (1)$$

Here $R_p$ and $R_a$ represent the junction resistances when the magnetization direction of the electrodes are parallel and antiparallel, respectively, and $G_p$ and $G_a$ are the equivalent conductances. $P_1$ and $P_2$ are the conduction electron spin polarization values of the two FM electrodes as measured by spin-polarized tunneling experiments with superconductors. Ideally, for ferromagnet materials having spin polarizations of 40% and 34% the above expression yields a theoretical JMR ($\Delta R/R$) of 24% in tunneling conductance due to the change in magnetization directions of the electrodes.

The ideal result given by the above mathematical expression neglects, however, limiting factors, such as, domain walls in the junction area, interfacial and barrier spin scattering, direct coupling between the two FM films, and surface degradation of FM films. In practice, all of these factors and perhaps others significantly impact the expected effect.

Various scientific groups experimenting mainly with nickel oxide (NiO) and aluminum oxide ($Al_2O_3$) as barriers between nickel (Ni) and cobalt (Co) electrodes have reported a small JMR in FM-I-FM devices. However, in most of these cases, the observed JMR's were between 2–6% at 4.2K at best, and typically only fractions of a percent at room temperature (295K). Recent experimental work by Miyazaki et al., J. Magn. Magn. Mater. 126, 430 (1993), showed a JMR of 2.7% at room temperature.

Scientists, including Miyazaki et al., for years, have known in theory about the fundamental dynamics of the tunnel resistance arising from conduction electron spin polarization. However, the past efforts in this area have failed to produce the level of change in the tunneling resistance adequate for any practical or effective use. To be of any significance, the JMR should be at least 10% in a typical application.

Consequently, a need exists for an FM-I-FM trilayer junction construction in which the magnitude of the junction resistive change is at least 10%. Tunnel junction devices implicate a wide range of practical uses. In particular, any devices requiring memory or a sensor element can be considered.

SUMMARY OF THE INVENTION

The present invention relates to a magnetic trilayer tunnel junction device having junction resistance and fabrication methods thereof. The present state of the art for read-heads now found in computers uses a property of magnetic materials known as anisotropic magnetoresistance (AMR), or more recently, giant magnetoresistance (GMR). But these materials require about 60 alternating layers of ferromagnetic and non-magnetic thin metal films in which the thickness of each layer must be precisely controlled.

In contrast, the tunnel junction magnetoresistance (JMR) device of the present invention comprises just three layers: two ferromagnetic films separated by an ultra thin insulating layer. The resulting device is thinner (less than 50 nanometers) and more sensitive than a GMR device, yet it does not require the level of precision control that a GMR device typically requires. Since the read-head of a computer storage device can be greatly reduced in dimensions with the use of the JMR device of the present invention, the amount of data a disk can hold is, in effect, significantly increased.

In a preferred embodiment, the junction device of the present invention comprises a first electrode having a first independent magnetization direction, a second electrode having a second independent magnetization direction, and an insulator between the first and second electrodes to form a trilayer tunnel junction. The resulting junction has an effective junction resistance which essentially constitutes a difference between the junction resistance and a parasitic resistance contributed by the electrodes near and throughout the junction. A small excitation of electromagnetic energy applied to the junction reverses at least one of the magnetization directions of the electrodes and causes a change in the junction resistance by at least 10% at room temperature with respect to the effective resistance.

The preferred embodiment further comprises electrical contacts connected to each of the first and second electrodes that extend beyond the junction area and are electrically continuous to the electrodes and form non-overlapping region with respect to the junction.

In the preferred embodiment, the first and second electrodes are typically ferromagnets (FM), each having an electron spin polarization value of about 0.5 or less. In other embodiments of the invention, the first and second electrodes can be half-metal ferromagnets (HMF). For an HMF, a higher electron spin polarization value of up to 1.0 can be allowed. In yet other embodiments, a combination of FM and HMF can be used to form tunneling devices.

In the preferred embodiment, the effective junction resistance of the device can be varied by controlling either the parasitic resistance or the junction resistance. The parasitic resistance can be controlled by selecting the electrodes of different thickness or electron spin polarization.

The junction resistance can be controlled by changing the thickness of the insulator layer. Preferably, the thickness of the insulator layer ranges from about 2 angstroms to 30 angstroms. The insulator layer is formed first by providing a thin precursor metal film selected from a group consisting of Al, Mg, Ta, Ti, Y, and Si. The thin film layer is than reacted with a reactive gas, typically anywhere from 2 to 110 seconds, to form a tunnel barrier. The thickness of the resulting barrier layer depends on the amount of the reaction duration applied. Preferably, the insulator is a surface-reacted metal film selected from a group consisting of $Al_2O_3$, AlN, $Si_3N_4$, MgO, $Ta_2O_5$, $TiO_2$, and $Y_2O_3$.

In a preferred embodiment, where the parasitic resistance is greater than the junction resistance, a negative effective resistance can result. For certain applications, therefore, the materials of the tunneling device can be controlled so that the effective junction resistance is initially negative then changes to become positive when the electromagnetic energy is applied to the junction.

The device of the present invention can be implemented in a system for diagnosing biological tissue samples. The system generally comprises a sensor for detecting any malignant portions of a biological tissue sample, which includes a matrix array of trilayer tunnel junction devices of the present invention as described above, and a display station connected to the sensor for receiving image signals to display color-mapped images of the sample to locate and diagnose the malignant portions of the sample. The tissue sample is pre-treated with a chemical coating containing a magnetic content which is essentially absorbed by healthy portions of the sample, and allows the sensor to distinguish the healthy portions from the malignant portions of the sample.

Other applications of the present invention include a computer storage device. The device generally comprises a magnetic disk for storing binary data, and a sensor-head for reading the data from the disk which includes the trilayer tunnel junction device of the present invention as described.

In the preferred embodiment, the trilayer tunneling device is fabricated by providing a flat smooth substrate in a vacuum evaporation chamber. The substrate is initially cooled by placing it on a liquid-nitrogen cooled metal surface. A thin seeding layer is overlayed onto the substrate to provide a basis for the device. The first (bottom) electrode is then deposited onto the seeding layer, followed by a thin precursor film of the insulating layer. Preferably, the precursor film is then gas reacted to form a tunnel barrier. Lastly, the top electrode is deposited on the insulating layer such that a region where the bottom and top electrodes overlap, separated by the insulating layer, forms a tunnel junction.

Preferred methods of depositing the electrode or the insulating film layer include sputtering, such as the radio frequency, direct current, or the ion beam magnetron sputtering.

Ideally, the metal film of the insulating layer is completely reacted by the reactive gas without causing reaction to the first electrode below, leaving only molecules of the reactive gas as the insulating layer. Preferably, however, the upper surface portion of the metal film is reacted with the reactive gas, leaving a portion of the metal film in contact with one side of the bottom electrode below. This keeps the top surface of the electrode clean, free of any surface corrosion.

In another embodiment, the ferromagnet electrodes and the metal film of the insulating layer can be either sputter deposited or evaporated, and the metal film is reacted with a reactive gas by glow discharge prior to depositing the top electrode. In either event, preferably, the first and second electrodes are deposited in a presence of an applied magnetic field to improve magnetic field response characteristics of the tunnel junction.

The above and other features of the invention including various novel details of construction and combinations of parts will now be more particularly described with reference to the accompanying drawings and pointed out in the claims. It will be understood that the particular devices and methods embodying the invention are shown by way of illustration only and not as limitations of the invention. The principles and features of this invention may be employed in varied and numerous embodiments without departing from the scope of the invention.

BRIEF DESCRIPTION OF THE DRAWINGS

FIG. 16A is a schematic/prospective drawing of a magnetic storage disk drive system.

FIG. 16B is an enlarged view of a read-write sensor head according to the invention.

DETAILED DESCRIPTION OF THE PREFERRED EMBODIMENTS

Figure 1:
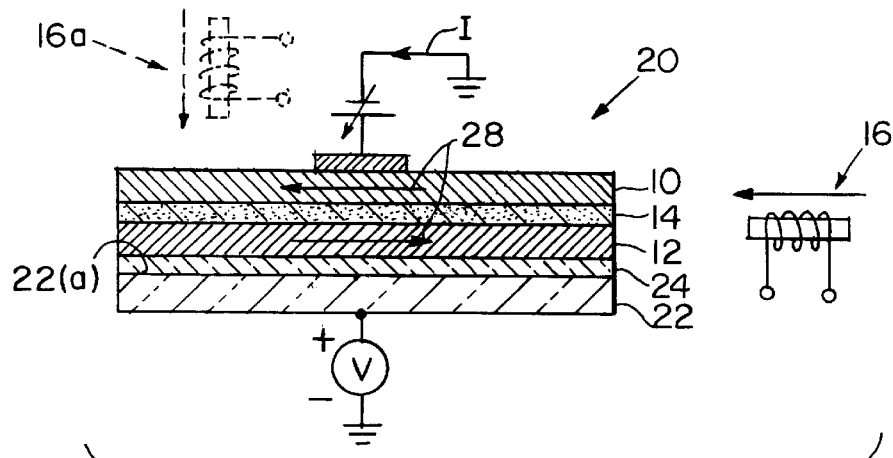
FIG. 1 is a schematic cross sectional diagram of a typical ferromagnet-insulator-ferromagnet trilayer junction in accordance with the invention.

Referring now to the drawings, FIG. 1 describes a preferred ferromagnet-insulator-ferromagnet FM-I-FM trilayer tunnel junction device of the present invention, wherein the current flowing through the device is represented by "I" and the voltage across the junction by "V". An electromagnetic energy source 16 affects magnetization direction 28 for each ferromagnet electrode by applying a small magnitude of magnetic field across the junction. To affect magnetization direction in each of the FM electrodes 12, 10, the plane of the trilayer tunnel junction 20 may be oriented in any position with respect to the direction of the applied field 16.

An example of a preferred method of fabricating the FM-I-FM thin film planar trilayer tunnel junction 20, as shown in FIG. 1, involves a vacuum evaporation process in which an aluminum oxide ($Al_2O_3$) is used as the insulating layer. In a vacuum evaporation chamber (not shown), a substrate 22 having a flat smooth upper surface 22a is initially cooled by placing the substrate in contact with a liquid-nitrogen cooled metal surface. The cooled surface 22a is then covered with a layer of about 10 Å of a suitable seeding layer 24, such as glass or silicone (Si). Next, a first FM metal film 12 of about 80 Å of thickness is laid on the seeding layer. An aluminum (Al) precursor film 14 of about 12 to 18 Å of thickness is then deposited over the entire top surface of the first FM layer 12. After bringing the substrate to room temperature, the Al precursor film 14 is oxidized by glow discharge to form an $Al_2O_3$ insulating tunnel barrier layer. This procedure oxidizes about 12–14 Å of the original Al film. Continuing in a vacuum, (cross strips of) a top FM electrode 10 of about 100 to 300 Å thick are laid on the insulating barrier layer 14 at room temperature.

The tunnel junction resistances of a device 20 can range from hundreds of ohms to tens of kilo-ohms, depending on the duration of the glow discharge and the type of FM materials used.

Preferred materials for the FM electrode pair in a trilayer tunnel junction include cobalt iron (CoFe) for the first FM film layer and either cobalt (Co) or nickel iron (NiFe) for the second counter FM layer. It is preferred that the FM layers have high conduction electron spin polarization (P) of 0.3 or greater. Preferably, the layers are formed by a vacuum evaporation process but other suitable process may be substituted, such as sputtering, electroplating or laser ablation. Preferably the substrate is glass, but other suitable materials include silicon, germanium, gallium arsenide wafers, and mica. The preferred insulator materials include like magnesium oxide and aluminum oxide. Preferably, the material for seeding layer provides high melting point of about 1000 degrees Celsius or greater. Preferred seeding layer materials include silicon, germanium and titanium oxide.

Figure 2:
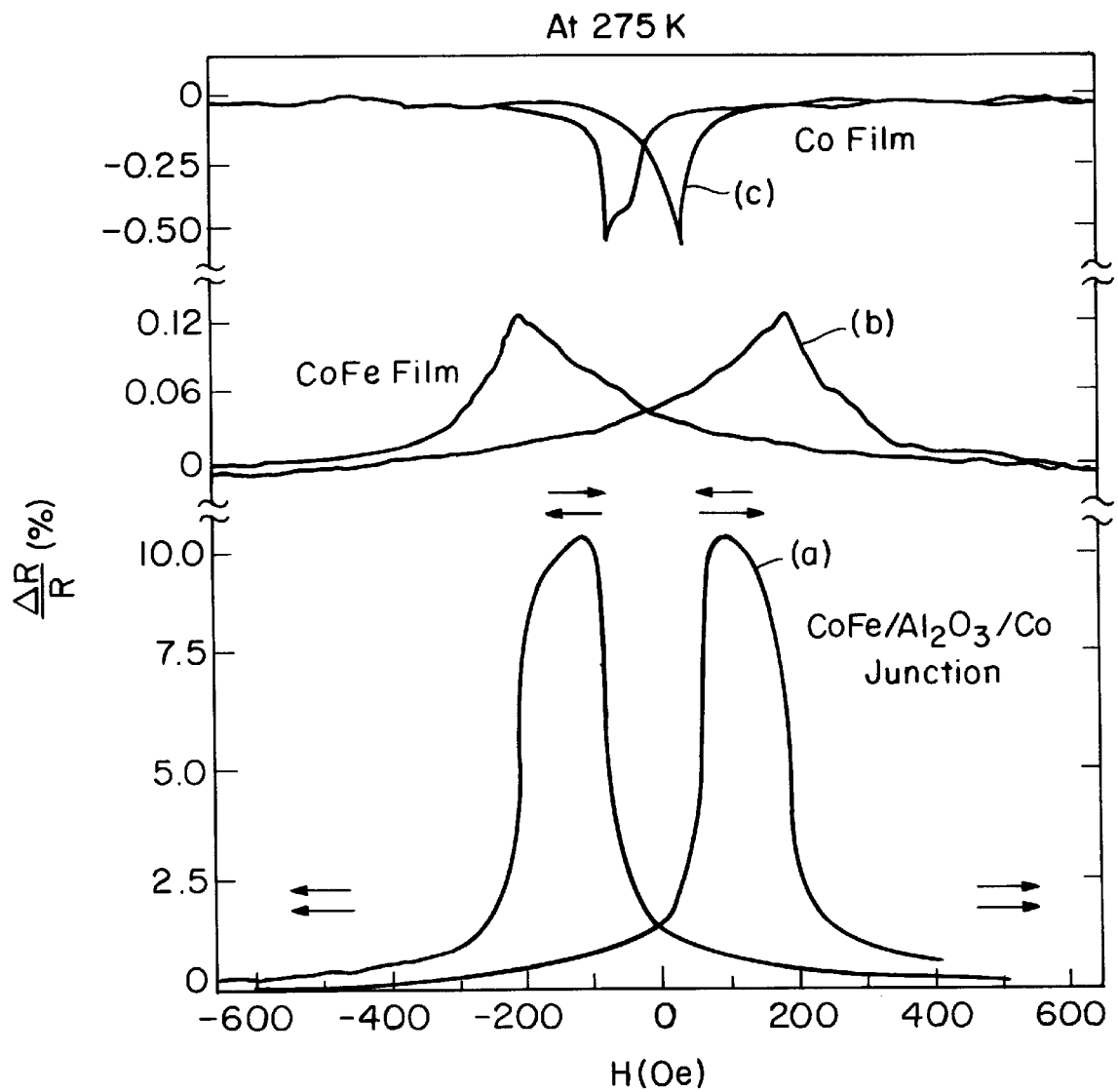
FIG. 2 is a set of plots showing change in resistance (JMR) as a function of applied magnetic field H in Oersted at 295K for a ferromagnet pair and a FM-I-FM trilayer junction.

FIG. 2 illustrates the magnetic field (H) dependence of junction resistance for a $CoFe/Al_2O_3/Co$ junction. In FIG. 2, the percent ratio of change in junction resistance to peak junction resistance $\Delta R/R$ of a $CoFe/Al_2O_3/Co$ trilayer junction as a function of H is shown in curve (a). The arrows on the junction curve (a) indicate the magnetization directions of the two ferromagnet films.

Curves (b) and (c) show the relative variation in resistance of the bottom (CoFe) and top (Co) FM films, respectively, Per se due to magnetic field at room temperature. In particular, these curves determine the coercive field magnitude (or "coercive force") ($H_c$) defined as the magnitude of field intensity required to change the magnetization direction in each FM electrode. In (c), $H_c$ for Co is approximately 100 Oe, whereas $H_c$ for CoFe in (b) is significantly greater at 200 Oe. In (a), the measured JMR ($\Delta R/R$) of the tunnel junction $CoFe/Al_2O_3/Co$ is 10.6% at room temperature.

The field dependence of in FM-I-FM tunnel junction resistance as shown in FIG. 2 can be explained qualitatively based on individual FM curves (b) and (c). At high fields (beyond the $H_c$ of the FM films), the magnetization of the two FM films are fully saturated and aligned in the same field direction. The tunneling probability and, hence, the current is high. As H decreases towards zero and changes sign, the magnetization direction of the film with lower $H_c$ (FM) reverses its direction, whereas for the film (CoFe) which has higher $H_c$ (bottom FM), its magnetization direction remains the same. In this field range (50 Oe to 250 Oe), the magnetization orientation of one film is antiparallel (opposite) to the other, the tunneling probability is lowered, the junction resistance increases rapidly, and the tunnel current decreases accordingly. Upon raising the field further in the reverse direction, the magnetization direction in the second film also reverses, becoming parallel to the first film, and the junction resistance begins to decline rapidly.

A significant JMR of over 10% observed at room temperature, as shown in FIG. 3 was attained from FM-I-FM junction devices having relatively high junction resistance ($R_J$), in the kilo-ohm (k$\Omega$) range, and large junction surface area, in the range of $10^3$ to $10^4$ cm$^2$. As the junction area is decreased to a few square microns for a typical device application, the junction impedance can reach on the order of several mega-ohms (M$\Omega$), creating noise problems.

For many applications, however, the preferred junction impedance is in the range of one to a few kilo-ohm. In accordance with the methods of the present invention, a lower tunnel junction resistance can be achieved by controlling the thickness of the insulator layer and, to a lesser extent, the thickness and the material content of the FM electrodes.

Figure 3A:
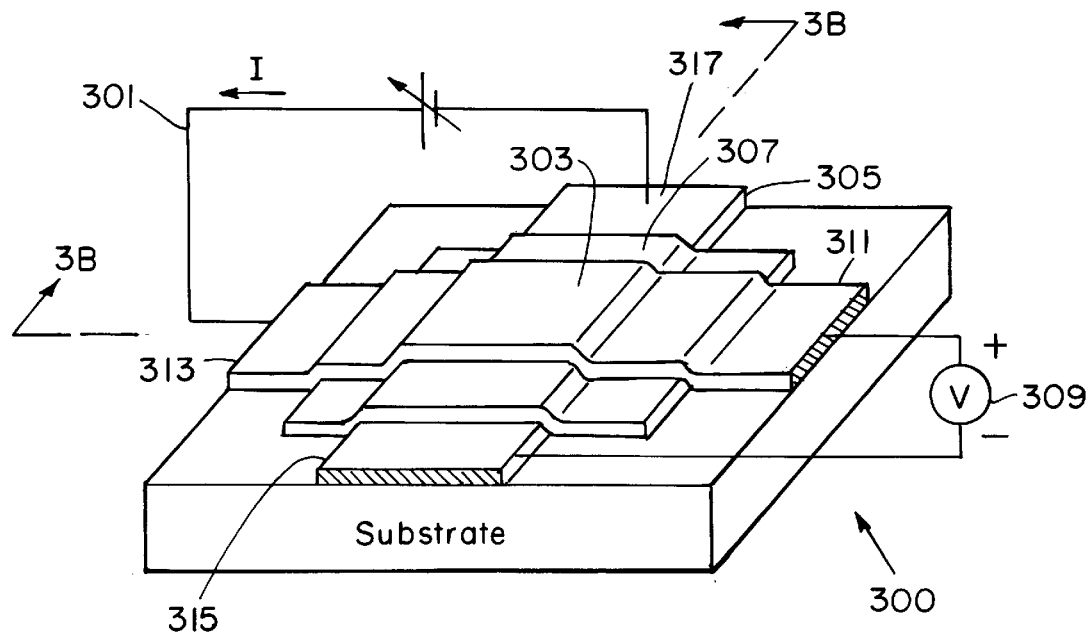
FIGS. 3A and 3B depict the four-terminal technique and the current path of a geometrically-enhanced FM-I-FM trilayer tunnel device in accordance with the present invention.

FIG. 3A illustrates a technique for reassuring tunnel junction resistance of a geometrically enhanced FM-I-FM tunneling device. The technique is commonly referred to as the "four terminal technique" (FTT) in which the current source 601 is connected to the free ends of the top and bottom FM electrodes 303, 305 of the device 300 and, similarly, the two electrical leads of a volt meter 309 are connected to the opposite free ends of the top and bottom electrodes 303, 305. The "effective" or measured junction resistance, $R_J$, can be determined from the relationship $R_J = V/I$.

In FIG. 3A, current (I) from the source 301 originating from the top FM electrode 303 flows through the junction area into the bottom electrode 305. Again, the junction area is defined as the region where the top and bottom electrodes overlap, the two electrodes being separated by a tunnel barrier or an insulator layer 307. The device 300 shown in FIG. 3A is another preferred embodiment of the present invention which is different from the more conventional trilayer tunnel junction described in FIG. 1 and which provides a significantly improved JMR response over the conventional device.

Figure 3B:
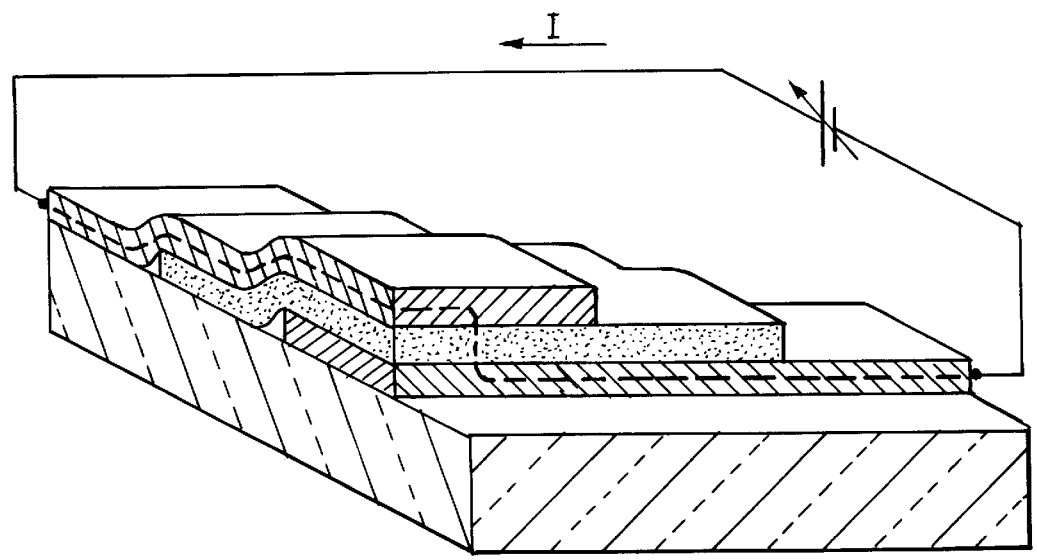

In FIG. 3A, two strips of Fm electrode layers 303, 305 are cross-layered on either side of an insulator to form a tunnel junction area in the center, leaving the four ends of the electrodes non-overlapping. In FIG. 3B, it is illustrated that the current (I) from the source 301 flows out from one end of the top electrode 303, through the junction area, crossing through the insulator layer 307, and flows out through one end of the bottom electrode 305 to complete a closed-loop current path. An important artifact of this electrical arrangement in a cross-geometry tunneling device is that the current flowing through the junction area is non-uniformly distributed, and, therefore, the effective junction resistance (i.e., measured $R_J=V/I$) does not reflect the "true" junction resistance, $R_T$.

Accordingly, the device of the present invention forming cross geometry includes non-trivial resistance, referred to herein as "lead resistance", $R_L$, originating from the portion of the film electrodes near and throughout the junction area. The effects of the lead resistance become quite significant particularly when the device is controlled to produce the true junction resistance ($R_T$) comparable or even smaller than $R_L$. Although the actual relationship between $R_T$, $R_J$ and $R_L$ for the device forming cross geometry is unknown, a simple resistance network model provides:

$$R_J=R_T[1-f(R_L/R_T)],$$

where $R_J<R_T$, and $f(R_T/R_L)$ forms a parasitic resistance whose magnitude ($\Omega$) depends on the relative values of $R_T$ and $R_L$.

Figure 4A:
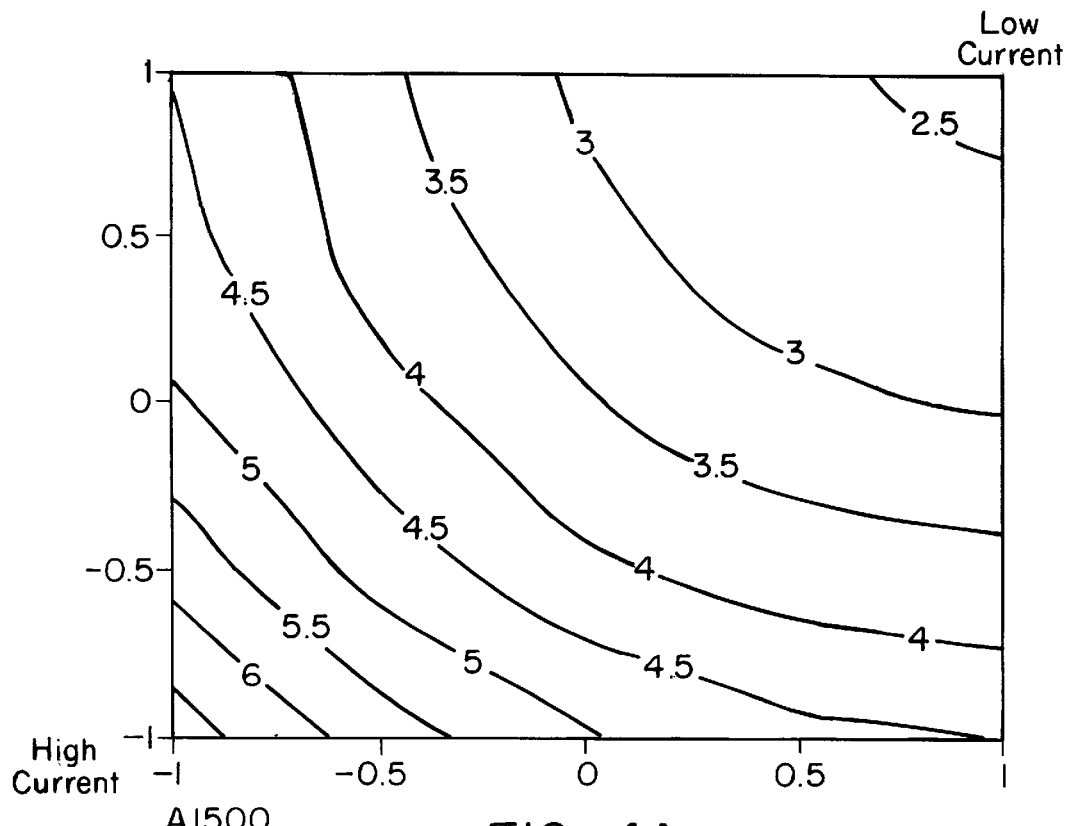
FIGS. 4A and 4B graphically illustrate current distribution in geometrically-enhanced FM-I-FM trilayer tunnel junctions of the present invention.
Figure 4B:
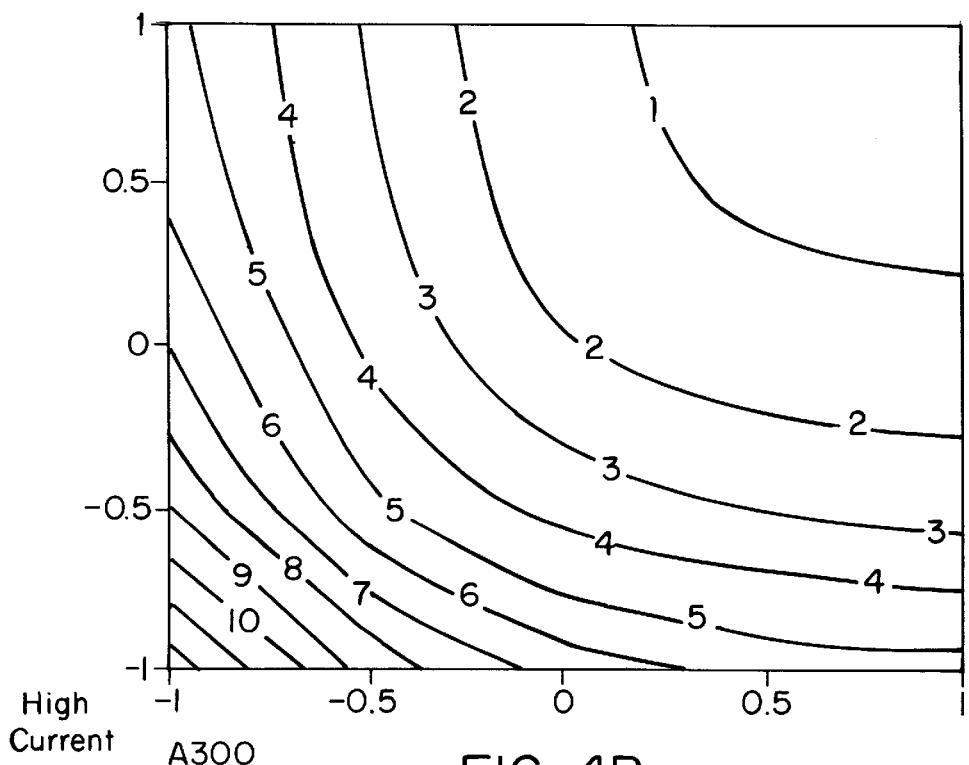

From this model, an "apparent" JMR can be derived as the ratio of change in the true junction resistance to the apparent junction resistance $\Delta R_T/R_J$. Also, from the above relationship, for $f(R_T/R_L)$ comparable to $R_T$, small or even negative $R_J$ can be attained, and thus a large apparent JMR (%) can be realized. Additionally, for a certain range of magnetic field excitations, the measured junction voltage or resistance can change polarity, operating as a bipolar switch. FIGS. 4A and 4B graphically describe junction areas of two different cross-geometry tunneling devices, having the non-uniform current distribution effect. FIGS. 4A and 4B demonstrate that this current flow is substantially greater in the lower left position of the junction surface, and is gradually reduced in the upper right portion of the junction. It follows that the resistance of the junction area is also non-uniform. In FIG. 4A the true junction resistance, $R_T$ is 60$\Omega$. However, the measured junction resistance $R_J$ is 32$\Omega$. The lead resistance is determined as $R_L=100\Omega$. Similarly, the device in FIG. 4B shows $R_T=12\Omega$, $R_J=-8\Omega$, and $R_L=100\Omega$.

Figure 5B:
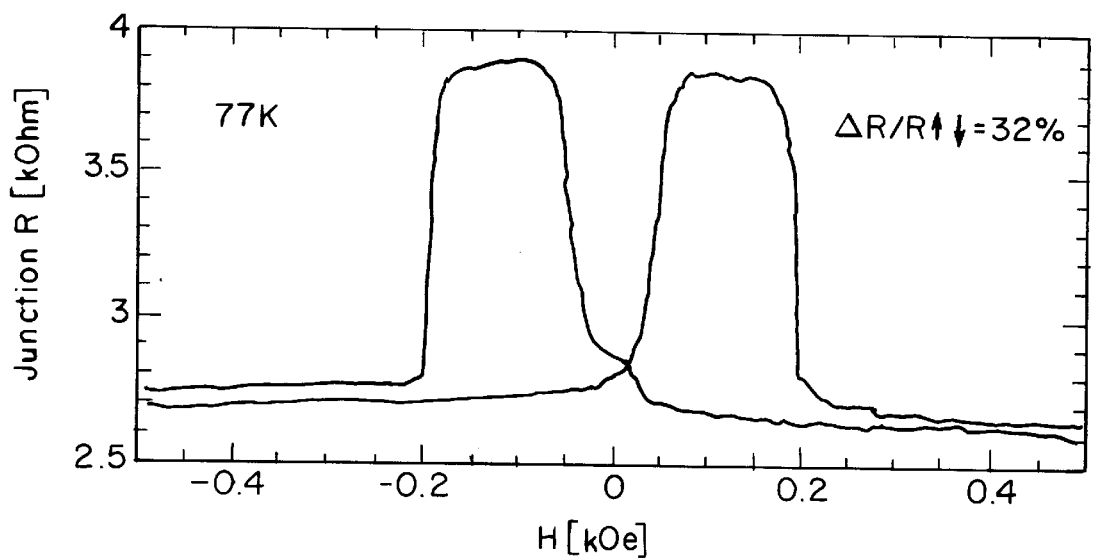
FIGS. 5A and 5B illustrate temperature variation of JMR of the FM-I-FM trilayer tunnel junction device of the present invention.
Figure 5A:
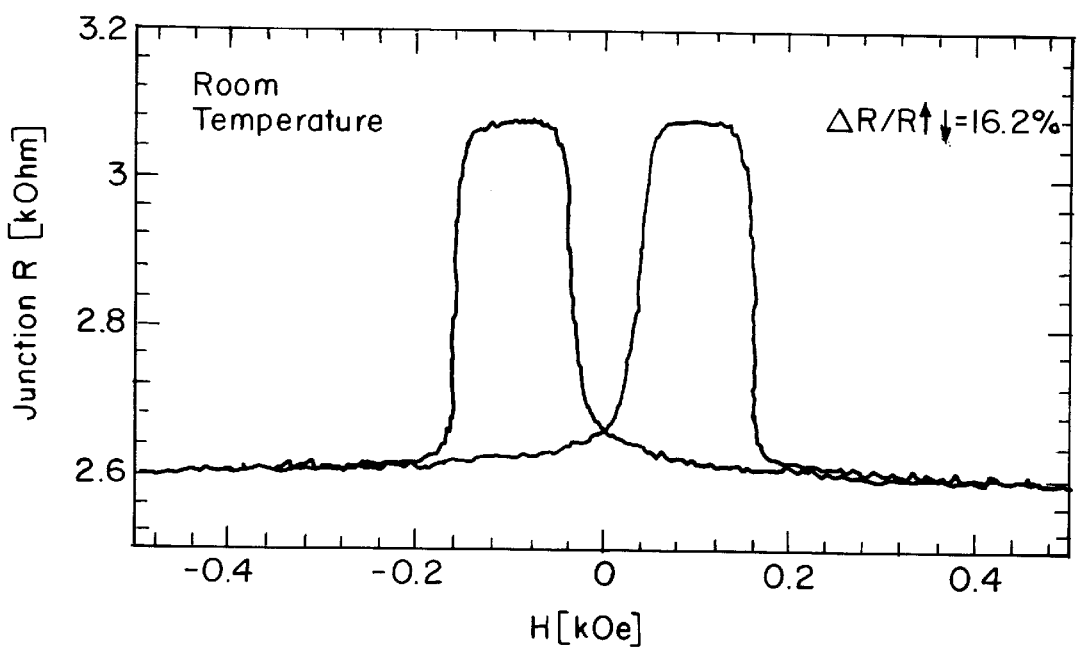

FIGS. 5A and 5B illustrate the temperature dependence of JMR in the geometrically-enhanced tunnel junctions of the present invention. The fact that the conventional tunneling junctions of the present invention yield a significantly greater JMR at temperatures below room temperature (275 K) was demonstrated in a U.S. application Ser. No. 08/407, 761, which is incorporated herein by reference. In FIGS. 5A and 5B, it can be seen that the JMR of a geometrically-enhanced CoFe/Al2O3/NiFe device doubles at 77 K (FIG. 5B), and confirms that these devices behave consistently with the conventional tunneling junctions.

Figure 6A:
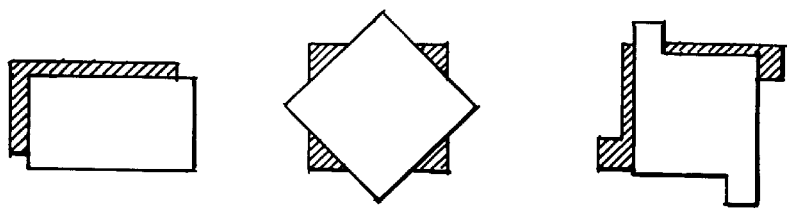
FIGS. 6A to 6C illustrate the possible device geometries of the geometrically-enhanced trilayer tunnel junction device of the present invention.
Figure 6B:
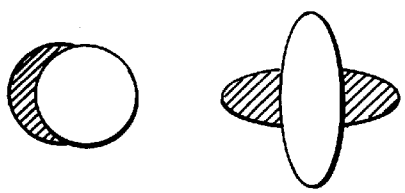
Figure 6C:
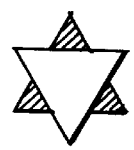

FIG. 6A illustrates other possible tunneling device geometries for enhancing JMR responses. In another preferred embodiment, devices in which the top electrode nearly exactly overlaps the bottom electrode may also be made to exhibit non-uniform current distribution and manifest the lead resistive effect in the junction area. In FIG. 6B, the top and bottom electrodes 622, 624 of a FM-I-FM device essentially overlap to form a junction area. Points of electrical contact 620, or the lead portions of the electrodes, however, form non-overlapping regions external to the junction area. In order to attain the desired lead resistive effect, the point of electrical contact must be physically continuous with respect to the remaining portion of the electrodes constituting the junction area.

Figure 7:
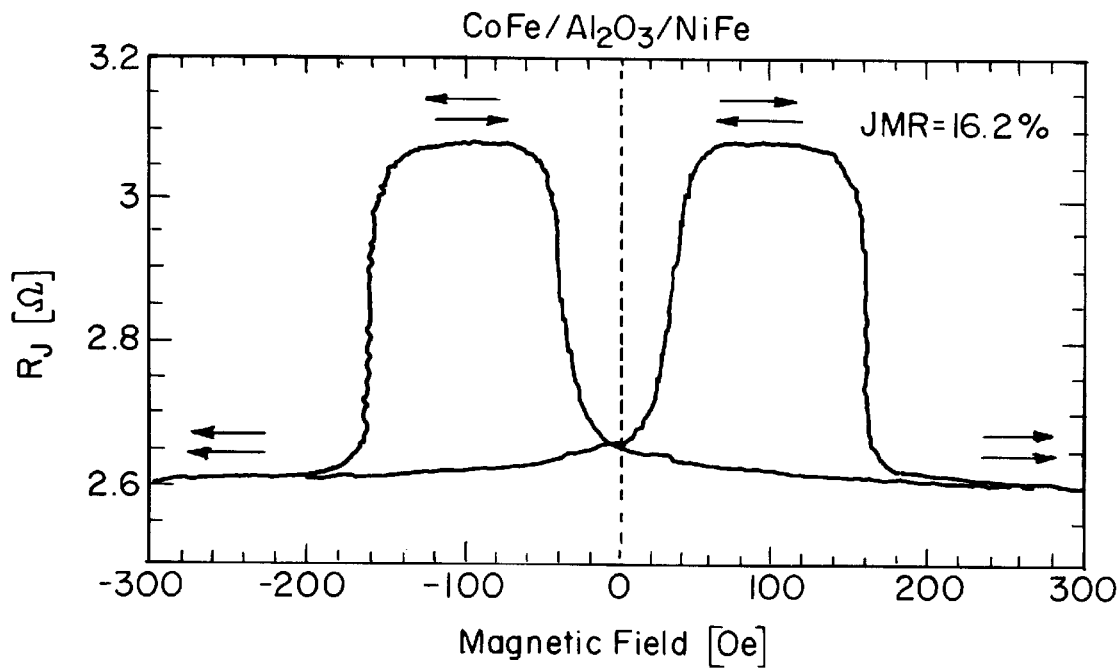
FIG. 7 is a magnetoresistance response at room temperature of a $CoFe/Al_2O_3/NiFe$ junction in the kilo-ohm range.

JMR's taken at room temperature for four different ranges of nominal junction resistance ($R_J$) are shown in FIGS. 7 to 10. As $R_J$ decreases from kilo-ohm (FIG. 7) to milli-ohm (FIG. 10), the apparent JMR ($\Delta R_T/R_J$) increases significantly going from 16.2% to 324%. FIG. 7 shows a magnetic response at room temperature of a geometrically-enhanced cobalt iron/aluminum oxide/nickel iron trilayer tunneling device having nominal $R_J$ of about 2.6 kilo-ohms. The device in FIG. 7 includes a cobalt-iron ferromagnet layer of 120 angstroms in thickness, an aluminum-oxide insulator layer of 12 angstroms in thickness, and an nickel-iron ferromagnet layer of 200 angstroms in thickness. The response in FIG. 7 shows a JMR of about 16.2%, which is about 60% greater than a typical response of a conventional device.

Figure 8:
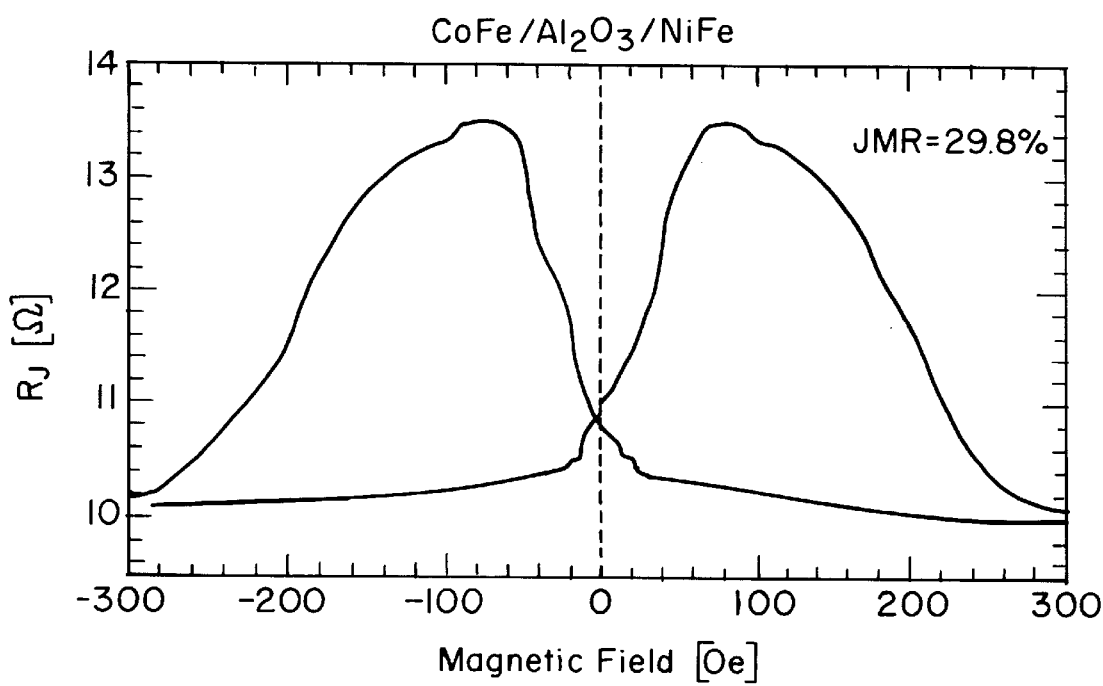
FIG. 8 is a magnetoresistance response at room temperature of a $CoFe/Al_2O_3/NiFe$ junction in a low resistance range.

FIG. 8 shows a response of another tunneling device of about 10 ohms in nominal $R_J$ having the same material composition as the one described in FIG. 7, but of different thickness. Here, the thickness of the CoFe, $Al_2O_3$ and NiFe layers are 80, 14, and 150 angstroms, respectively.

FIG. 8 demonstrates that a significantly greater gain in JMR of about 30% can be achieved partly by lowering the terminal junction resistance.

Figure 9:
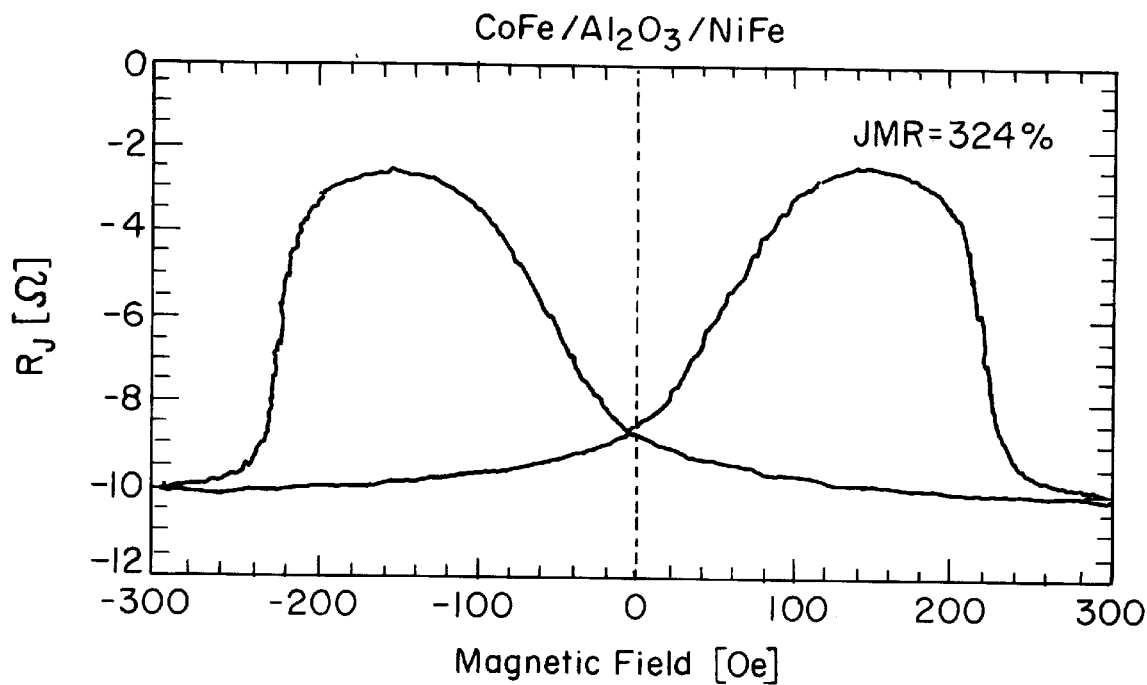
FIG. 9 is a negative magnetoresistance response of a $CoFe/Al_2O_3/NiFe$ junction.

Similarly, FIG. 9 shows a CoFe (100 Å)/$Al_2O_3$ (16 Å)/Co (100 Å) device having large JMR in which a negative $R_J$ is maintained throughout the magnetic field spectrum, which indicates that the parasitic resistive effect, $f(R_L/R_T)$, dominates over the true junction resistance, $R_T$.

Figure 10:
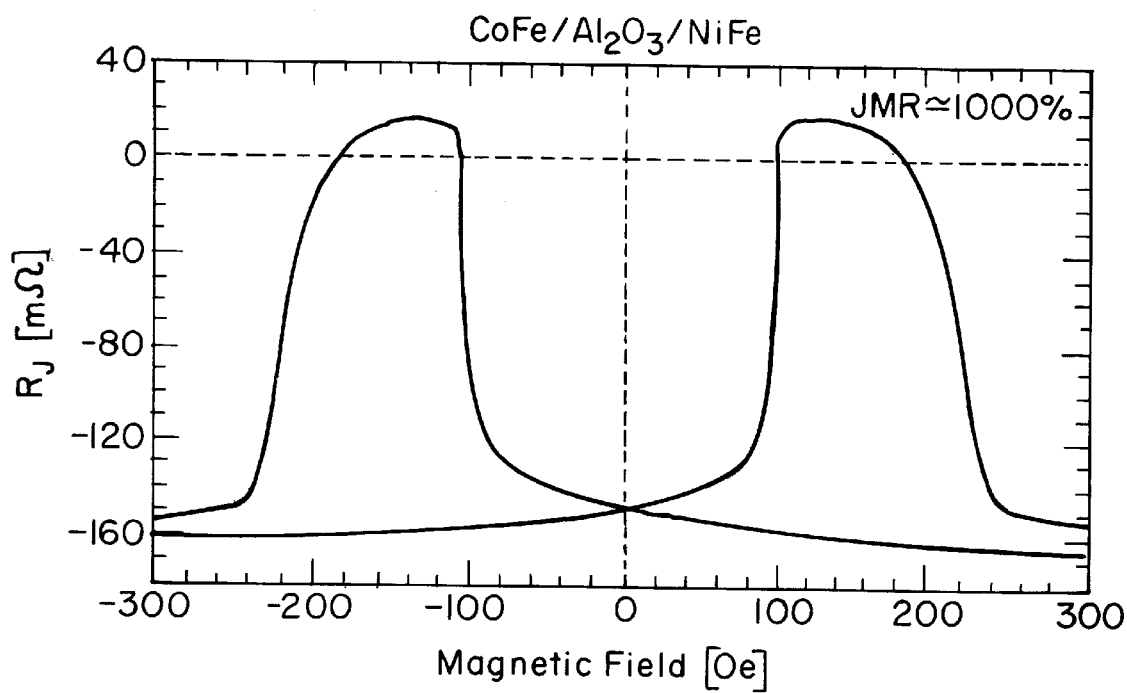
FIG. 10 is a magnetoresistance response at room temperature of a $CoFe/Al_2O_3/NiFe$ junction in the mili-ohm range illustrating a resistive polarity switch.

FIG. 10 is a magnetic response of a CoFe (100 Å)/AlN (18 Å)/NiFe (27 Å) trilayer junction device. In FIG. 10, it is illustrated that a tunnel junction can be made to operate as a switch by providing positive $R_J$ in one magnetic field region and negative in another.

Figure 11:
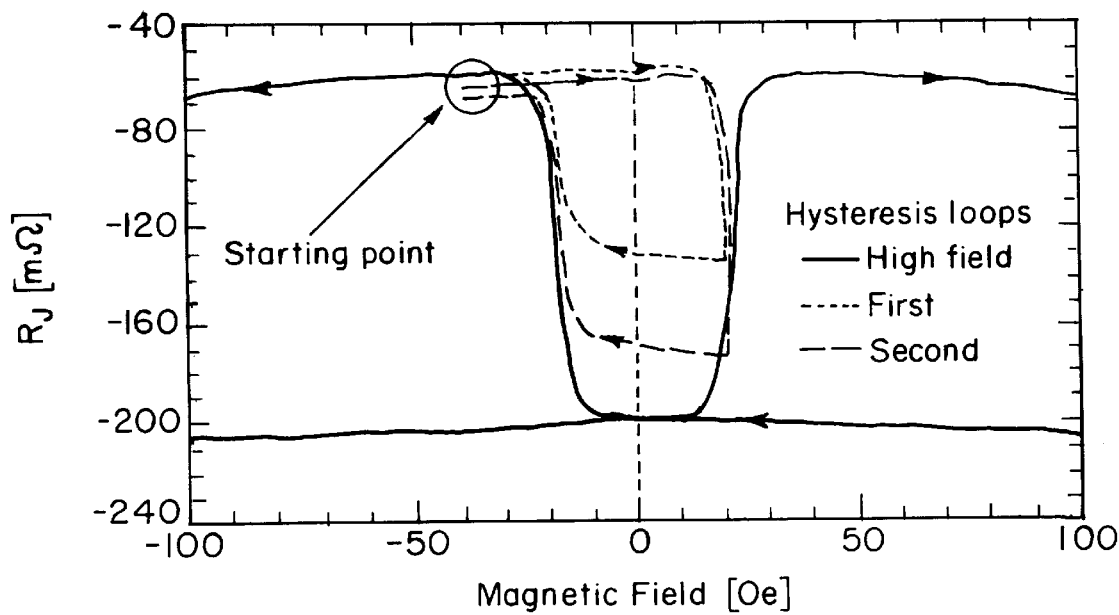
FIG. 11 is a magnetoresistance response in the mili-ohm range of a CoFe/AlN/NiFe junction showing the hysteresis property of a tunnel junction device.

FIG. 11 shows the memory effect of JMR of a preferred trilayer device. The junction is initially subjected to high field in one direction. Upon reducing field level to zero and with a small applied field in the reverse direction ($-H_p$), the peak value of $R_J$ is reached. Reducing the field level back to zero does not alter the peak value of $R_J$. This high value of $R_J$ is stable and can be maintained even with a small positive field excitation. Applying further field excitation in the forward direction to $H_p$ decreases $R_J$ and minor hysteresis loop is formed.

For the geometrically-enhanced tunneling device as depicted in FIGS. 3A to 3C, and the responses shown in FIGS. 7 to 10, large JMR's can be realized by controlling the relative values of $R_L$ and $R_T$. In particular, $R_L$ can be varied by controlling the thickness or appropriately selecting the FM electrodes. Similarly, $R_T$ can be varied by controlling the thickness of the insulating layer. In a preferred embodiment, the FM film electrodes can range from about 10 angstroms to 1000 angstroms (1 to 100 nanometers), and the insulator barrier can be as thin as about 2 angstroms (0.2 nm), and as thick as about to 30 angstroms (3 nm).

Controlling the barrier thickness involves, inter alia, controlling the oxidation or nitriding duration in a vacuum evaporation or a sputtering process. For example, an oxidation by a glow discharge process can range anywhere from 2 to 110 seconds. Studies have shown that the junction resistance ($R_T$) is quite sensitive to the barrier thickness and changes nearly exponentially with respect to it. For example, the following shows is typical junction resistance range with respect to small variations in the barrier thickness:

| barrier thickness, Å | $R_T$, Ω |
|---|---|
| 14 | 10K |
| 12 | 1K |
| 8 | 10 |

As shown, resistance drops considerably, for thinner barriers.

The magnetic field sensitivity of the tunneling devices can also be controlled by selecting appropriate FM materials having desired spin-polarization constants. The field sensitivity determines the amount of field strength required for a FM electrode to reverse its magnetization direction. By controlling the FM sensitivity, a device can be made to maintain a desirable hysteresis width for an application where such parameter is of importance.

Figure 19A:
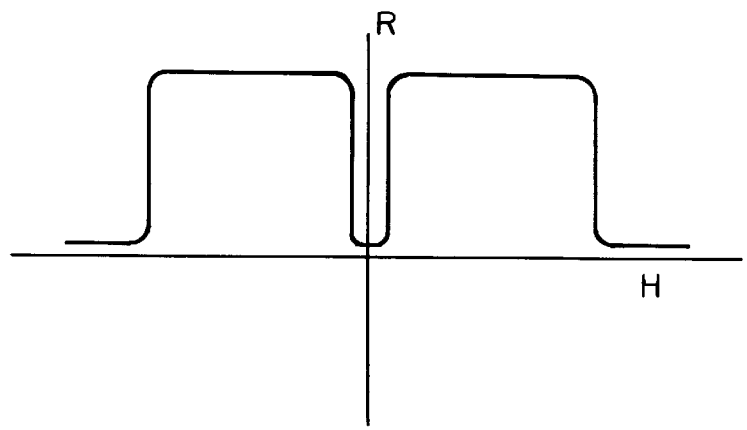
FIGS. 19A to 19C graphically illustrates the effects of ferromagnets having different coercive forces.
Figure 19B:
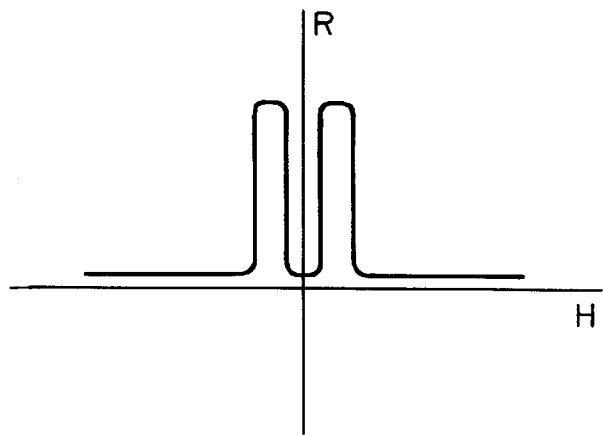
Figure 19C:
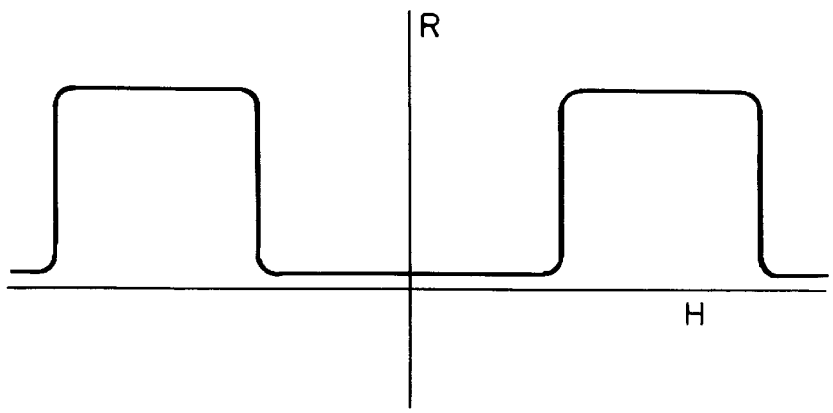

Additionally, FM electrodes can be selected to control certain field response behavior. For example, FIGS. 19A to 19C illustrate field responses of tunnel devices, each device comprising FM electrodes of different combination of coercive field ($H_c$) values. FIG. 19A is a response of a device in which the coercive force ($H_{c1}$) of a first electrode ($FM_1$) is significantly smaller than that ($H_{c2}$) of the second electrode ($FM_2$). The response in FIG. 19A shows that the junction resistance is relatively insensitive to field changes. FIG. 19B is a response of a device in which $H_{c1}$ is nearly identical to $H_{c2}$ and shows that the change in junction resistance can be made quite sensitive to a small change in field just by appropriately selecting FM electrodes of similar coercive properties. FIG. 19C is a response of a device in which $H_{c1} \neq H_{c2}$, and where both $H_{c1}$ and $H_{c2}$ are quite large. Each application can require different field constraints, and a designer can choose different FM combinations to satisfy such requirements.

From the above discussions, it is evident that in tunnel junctions where the lead resistance $R_L$ contribution to the measured junction resistance $R_J$ becomes significant, the apparent JMR does not reflect the true percentage changes of the tunneling resistance. It is an artifact of the ill-defined four-terminal measurement in the cross geometry of the FM electrodes of the tunnel device. The current distribution is inhomogeneous over the junction area when the two electrodes are perpendicularly crossed to form non-overlapping areas and $R_L$ is comparable or greater than the true junction resistance $R_T$. Studies of known resistors show that $R_J$ approaches $R_T$ only when $R_T > 3 R_L$. In fact, when $R_T / R_L$ ratio is 0.2 or below, $R_J$ is close to zero or negative, respectively.

Figure 18:
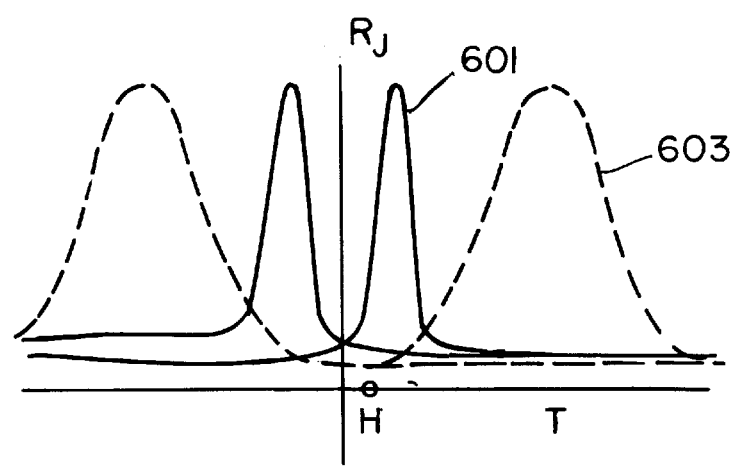
FIG. 18 graphically illustrates the effect of depositing ferromagnet layers under applied magnetic field.

A preferred method of fabricating geometrically enhanced tunnel junctions includes a vacuum evaporation process in a chamber pressurized to about $8 \times 10^{-8}$ Torr. In the chamber, a silicon seed layer of about 1 nanometer (nm) in thickness is placed on a liquid nitrogen cooled glass substrate. The bottom ferromagnetic film strip, such as CoFe of about 10 nm in thickness, is deposited on the seed layer. Preferably, the ferromagnetic films are deposited in the presence of about 100 Oe of applied magnetic field. In another preferred embodiment, a bottom ferromagnetic layer can be prepared in room temperature without the silicon seeding layer. Applying magnetic field during the deposition stage improves the field sensitivity of the junction device. FIG. 18 illustrates that the junction 601, which was prepared in the presence of a nominal magnetic field undergoes resistive change at a significantly lower field excitation level than the similar field response for a device 603 formed in the absence of applied magnetic field.

An insulating layer, such as an aluminum metal film of preferred thickness of about 0.4 to 1.8 nm, overlays the bottom ferromagnetic film entirely. After warming the substrate to room temperature, the Aluminum layer is subjected to glow discharge to form an insulating tunnel barrier. In the preferred embodiment, the glow discharge duration ranges from about a few to 110 seconds at a dc-bias of about 1 to 1.8 kV. The preferred overall thickness of the insulating layer ranges from a fraction of 1 nm to about 3 nm. As discussed, the glow-discharge or sputtering duration impacts the overall insulator thickness which in turn controls the junction resistance. In general, the experiments have shown that nitriding the insulator layer, such as aluminum (i.e., AlN) results in a lower junction resistance compared to oxidizing (i.e., $Al_2O_3$) for the same glow discharge conditions. In order to keep the contact surface of the first FM electrode clean and to avoid surface reaction, a very thin layer of insulating metal layer is left in the junction area. Otherwise, a nearly perfect reactive treatment of the insulating metal film (such as Al, Mg, or Y) is required to leave no metal behind, to provide an "ideal" tunnel barrier, without reacting the surface of the first FM electrode.

The top ferromagnetic film of about 5 to 20 nm in thickness, such as Co or nickel iron ($Ni_{0.8}Fe_{0.2}$), is subsequently deposited in the presence of a nominal field over the insulating barrier to form a cross geometry junction.

Other preferred methods of forming tunnel junction include various sputtering techniques to form the ferromagnetic electrodes. These include radio frequency (RF), direct current (DC) magnetron, and ion-beam sputtering techniques. Similarly, a tunnel barrier can also be sputter-deposited with or without the presence of reactive gas. In another embodiment, sputtering and vacuum evaporation methods can be combined to form tunneling devices. In this approach, the FM electrodes can be evaporated and the insulator sputter-deposited. Alternatively, the FM electrodes can be sputter-deposited and the barrier evaporated. A tunnel barrier can also be partly evaporated and then reacted with gas, or partly sputtered.

As discussed above, selecting appropriate materials of desired electrical properties and thickness are important in controlling the junction resistance. Appropriate insulating materials to form over the first FM electrode include aluminum (Al), magnesium (Mg), tantalum (Ta), titanium (Ti), yttrium (Y), and silicon (Si). Furthermore, sputtering or evaporation can be performed to form a composite insulating layer such as aluminum oxide ($Al_2O_3$), aluminum nitride, silicon nitride, magnesium oxide, tantalum pentoxide, titanium oxide, yttrium oxide.

Preferred ferromagnet materials include CoFe, Co and nickel iron alloy ($Ni_{0.8}Fe_{0.2}$). For a conventional ferromagnet or an alloy, the preferred polarization value is about 0.5 or less. Unconventional ferromagnets, such as half-metallic ferromagnets (HMF) can also be used in tunnel junctions. For example, nickel manganese antimony (NiMnSb) or platinum manganese antimony (PtMnSb) can be used. For HMF's much higher polarization values, up to p=1.0, are afforded to yield greater JMR effects. Also, an HMF layer can be formed in combination with an FM layer to make a trilayer tunneling device as needed for various applications (i.e., HMF/I/FM or FM/I/HMF).

Figure 13:
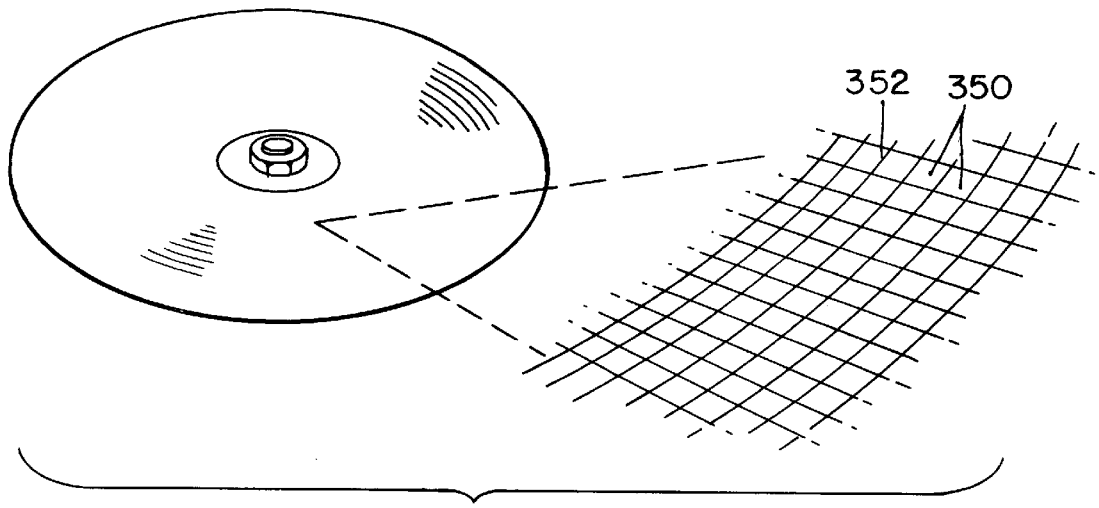
FIG. 13 is an enlarged view of the disk surface coated with FM-I-FM memory cells.
Figure 14:
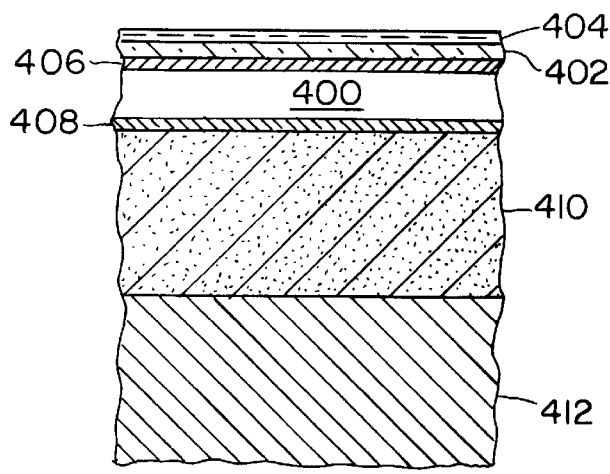
FIG. 14 is a sectional view of the multi-layer disk surface including a layer of FM-I-FM memory cells.
Figure 12:
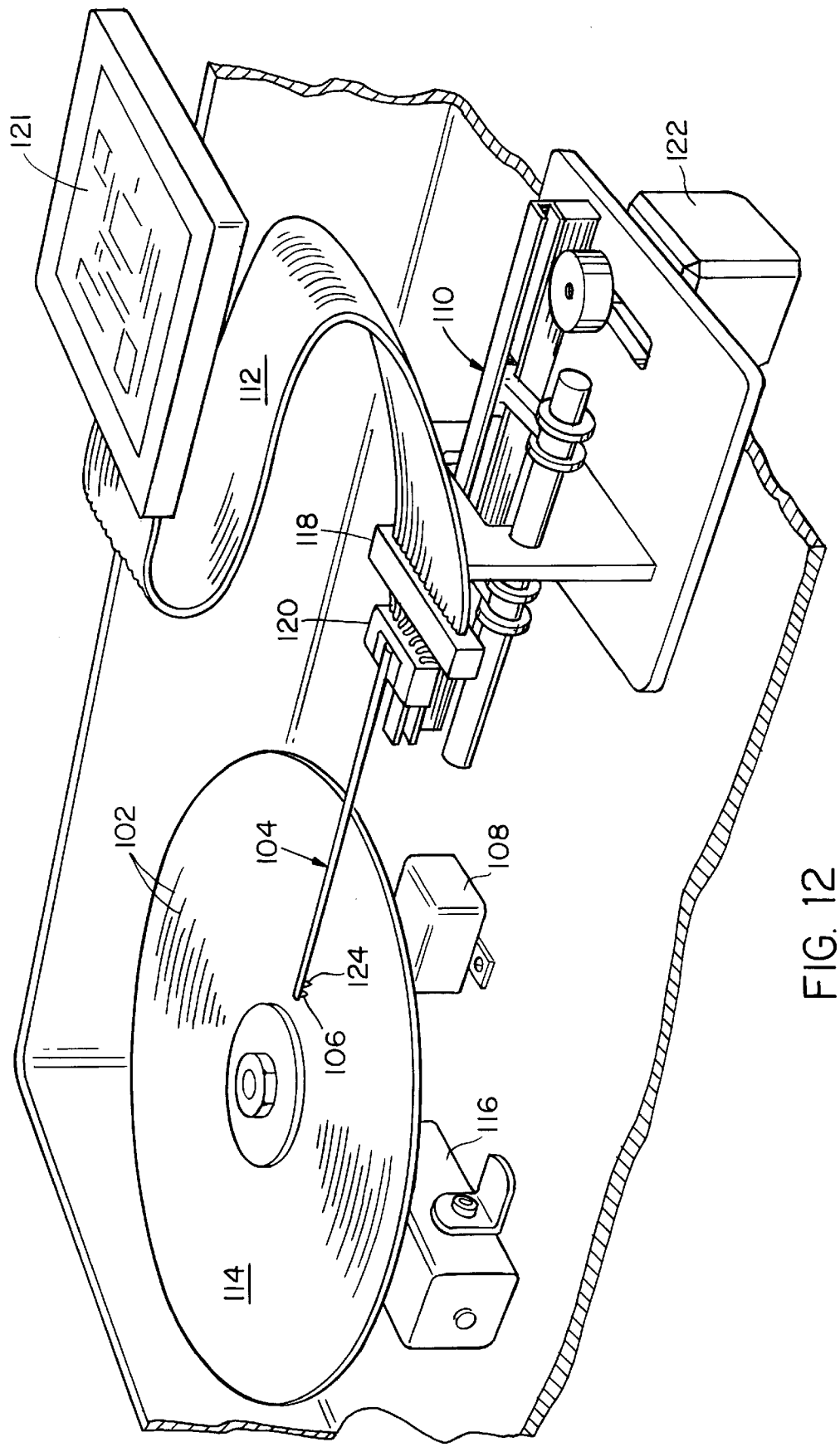
FIG. 12 is schematic prospective drawing of a memory device according to the invention.

FIG. 12 shows a memory storage device wherein a layer of a large number of FM-I-FM trilayer tunnel junctions 102 of the present invention are coated onto a disk surface 114 for storing a series of read-write binary data. FIG. 13 is an enlarged view (top) of such a disk surface prior to applying the protective coating, where an individual FM-I-FM junction cell 300 is isolated from the other by a micro-thin insulator material 302. FIG. 14 is a sectional view of the same disk surface (top half) which includes the layer of FM-I-FM junction 400 below a conducting layer 406, a protective coating 402 and an optional liquid lubricant layer 404. A layer 408 immediately below the trilayer junction is another conducting layer forming a closed-loop system. Below the second conducting layer is an electroless layer 410, and, finally, a substrate layer 412 underlies the entire structure. A group of such FM-I-FM junctions are arranged in a certain pattern to form a "sector", and a group of such sectors are arranged to form a "block". In FIG. 12, each block or sector of data being written into or retrieved from the disk is particularly addressed for unrestricted access by the central processing unit (CPU) 121.

The memory device of the present invention is nonvolatile (data is maintained even when power is switched off). Furthermore, the resistive value of the trilayer junction, which represents a binary high ("1") or low ("0") can be maintained passively, requiring very little or no steady state external power. For example, a micro-coil 106 at the proximal end of a movable head 104 provides applied electromagnetic energy to affect the magnetization directions and to set the binary states of the individual sectors of FM-I-FM tunnel junctions. Once the binary states are set, the electromagnetic energy is no longer needed (i.e., switched off) to maintain such states. In a blown up view, the detail of this operation is illustrated in FIG. 1, wherein the coil 16 provides magnetic field excitation similar to that of the micro-coil 106 in FIG. 12. The application of electromagnetic energy in FIG. 12 constitutes writing operation whereby the changes in resistance states of individual FM-I-FM junction cells correspond to a new entry of binary ones and zeros.

A sensor head 124 near the proximal end of such movable head and adjacent to the micro-coil 106 performs a read operation by either measuring conductance or magnetic field across the FM-I-FM tunnel junctions. A read operation by measuring conductance can also be illustrated with the circuit in FIG. 1. The sensor head of the present figure functions as the current source of FIG. 1. By measuring the corresponding voltage drop, the resistance of a particular FM-I-FM junction cell can easily be determined. The positional head is controlled by a controller 120 and is coupled to an actuator device 110. The coupled unit comprising positional head and the actuator is then driven by a stepping motor 122 A data path 112 carries instructional signals and data exchanged between the CPU (central processing unit) and a disk interface 118 which channels information bits to appropriate devices in the system. The instructional signals include a set of control signals routed to the controller for displacing the positional head. The instructional signals also include a signal to drive a high speed motor 116 coupled to the disk to displace the disk to a proper reading or writing orientation. A multi-output power supply 108 includes separate voltage lines to power the disk motor 116 as well as the stepping motor 122.

Figure 15:
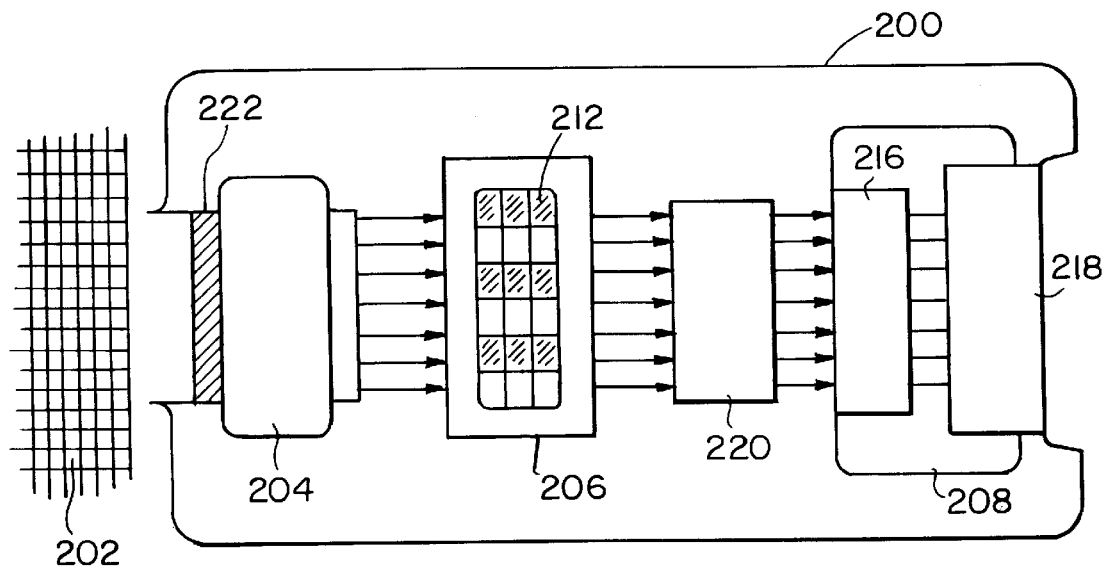
FIG. 15 is a schematic drawing of a sensor device according to the invention.

FIG. 15 shows a high precision multi-sensor system 200 wherein an integrated circuit (IC) 206 comprises a plurality of FM-I-FM trilayer tunnel junctions 212 of the present invention. Block 202 represents an arbitrary set of conditions (i.e., temperature, air pollutants, gas, etc.) being monitored by the system. A set of physical parameters corresponding to these conditions are quantified by a sensor interface 222, and then electrically transduced by a signal transducer 204 into a particular range of magnetic field values. The FM-I-FM junctions are arranged to form a matrix array of information carrying bits, wherein each bit is either a binary "1" or "0". Multiple-bit words (e.g., 8-bit, 16-bit, 32-bit etc.) are constructed as required to record and monitor physical conditions continuously. The information contained in the IC matrix is digitally sampled and decoded by a decoder 220. An output device 208 comprising a recording device 216 and a display device 218 processes decoded data in real time.

FIG. 16A illustrates yet another embodiment of the present invention involving a high performance sensor. FIG. 16A is a schematic of a portion of magnetic storage disk drive using a sensor in accordance with the invention having a rotatable disk 502, a stepping motor 504, a position actuator 506, and a read-write sensor head 508. The inset in FIG. 16B shows an enlarged view of the read-write sensor head 508 comprising two FM-I-FM trilayer junctions 510 placed near the top and bottom surfaces of the disk. These surfaces of the disk are magnetically coated. Each of these magnetic surfaces is made up of cells representing bits of binary data. Each cell has a magnetization direction which is detectable by the sensor head (e.g., a cell having a high bit would cause to change the magnetization direction of the trilayer junction on the sensor head thereby creating a signal voltage). The actuator 506, coupled to the sensor head 508, moves the sensor head linearly or angularly across the disk surface to read or write binary information. The stepping motor 504 linearly drives the actuator. The sensor head made according to the present invention provides significantly improved signal-to-noise ratio at reduced weight, size and power consumption over the conventional heads. A sensor head comprising FM-I-FM junctions can easily be integrated into other forms of magnetic storage devices such as tape and floppy drives by replacing the existing read-write mechanism.

Figure 17A:
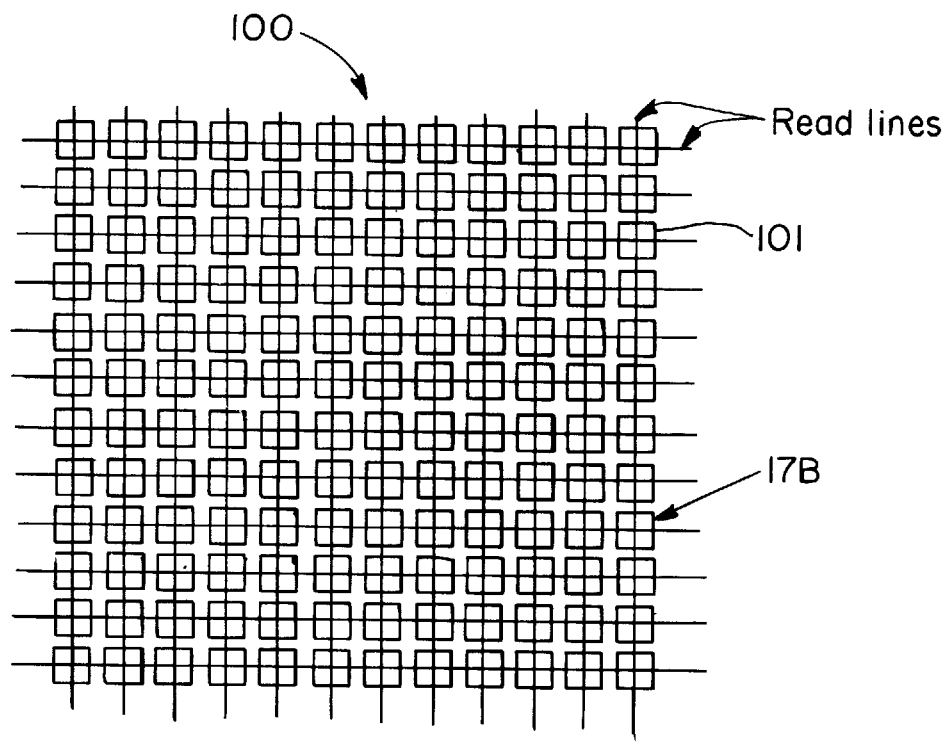
FIGS. 17A to 17C illustrates a medical imaging device in accordance with the present invention.
Figure 17B:
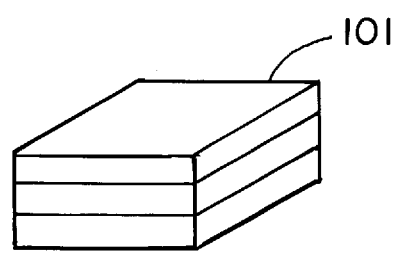
Figure 17C:
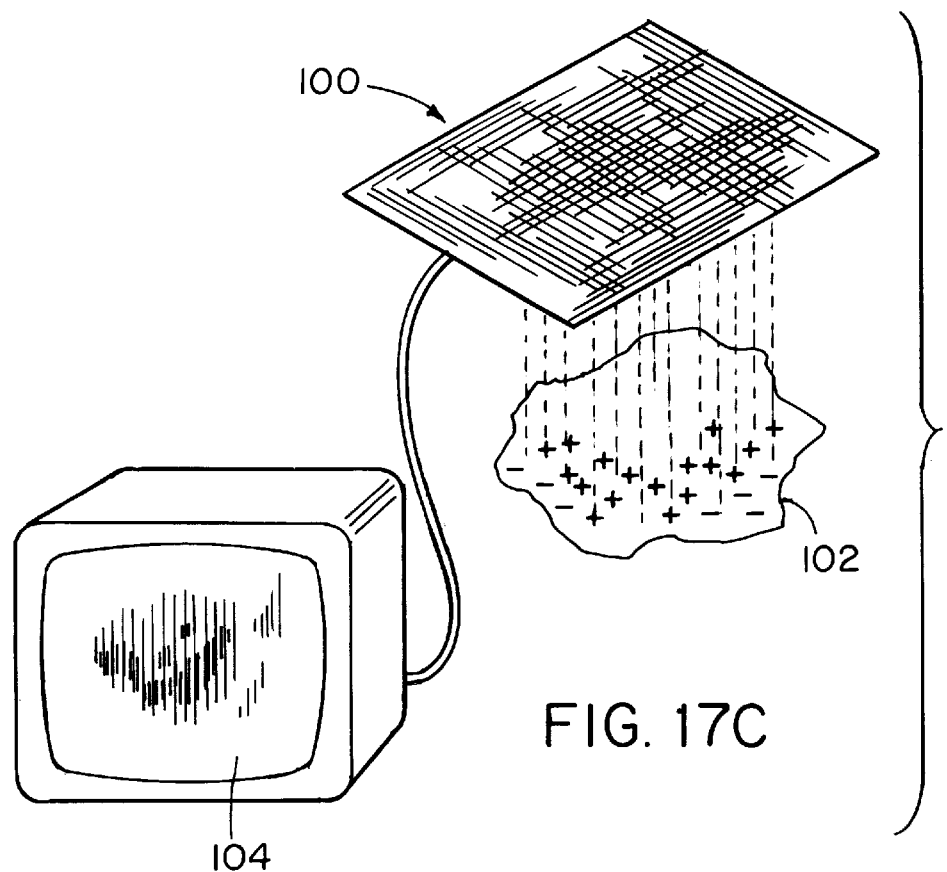

FIG. 17A illustrates a medical imaging device which includes an array of magnetic sensor elements 100 for detecting a malignant cell or region of cells in a biological tissue sample 102. Each sensor element 100 of dimensions in the micron range comprises an FM-I-FM trilayer tunneling device of the present invention providing junction magnetoresistance (JMR) of greater than 10% (see FIG. 17B). Preferably, each tunnel junction device is geometrically enhanced and is of low junction resistance to alleviate any noise problems associated with micron-level devices. The tissue sample 102 is pre-treated with magnetic coating which is absorbed by the healthy cells but otherwise non-absorbent by the cancerous or malignant cells. As shown in FIG. 17C, the sensor elements 100 identify malignant cells by detecting any resistive change (i.e., JMR) registered by the individual tunneling device. Malignant cells are easily identifiable from the magnetic presence on these cells. The sensor signals can be transmitted to a display station 104 for diagnosis. The diagnosis includes analyzing the magnitude of the sensor signals, corresponding to JMR, to identify the type and the severity of the cancerous cells. Additionally, the device of the present invention can be implemented in a magnetic force microscope which is used as a detector to map out malignant regions in a larger biological tissue samples.

Equivalents

While the invention has been described in connection with specific methods and apparatus, it is to be understood that the description is by way of example and not as a limitation to the scope of the invention as set forth in the claims.

What is claimed is:

1. A junction magnetoresistance system having a junction resistance comprising:
   a first electrode having a first independent magnetization direction;
   a second electrode having a second independent magnetization direction;
   an insulator between the first and second electrodes to form a trilayer tunnel junction having an effective junction resistance equal to the difference between the junction resistance and a parasitic resistance contributed by the electrodes near and throughout the junction;
   an electromagnetic source for applying electromagnetic energy to the junction, said energy reversing at least one of the magnetization directions of the first and second electrodes causing a change in the junction resistance by at least 10% at room temperature with respect to the effective junction resistance.

2. A device as claimed in claim 1 further comprising electrical contacts connected to each of the first and second electrodes, wherein the first and second electrodes overlap in the junction, and the contacts extend beyond the junction and are electrically continuous with the electrodes and form non-overlapping region with respect to the junction.

3. A device as claimed in claim 1 wherein the first and second electrodes are ferromagnets.

4. A device as claimed in claim 3 wherein each of the ferromagnets has an electron spin polarization value of about 0.5 or less.

5. A device as claimed in claim 1 wherein the first and second electrodes are half-metal ferromagnets.

6. A device as claimed in claim 5 wherein each of the half-metal ferromagnets has an electron spin polarization value of about 1.0 or less.

7. A device as claimed in claim 1 wherein one of the first and second electrodes is a ferromagnet and the other is a half-metal ferromagnet.

8. A device as claimed in claim 1 wherein the parasitic resistance is controlled by varying the electrodes in thickness.

9. A device as claimed in claim 1 wherein the parasitic resistance can be varied by selecting either of the first and second electrodes of a different electron spin polarization value.

10. A device as claimed in claim 1 wherein the insulator layer ranges from about 2 angstroms to 30 angstroms in thickness.

11. A device as claimed in claim 1 wherein the insulator comprises a metal film selected from a group consisting of Al, Mg, Ta, Ti, Y, and Si.

12. A device as claimed in claim 11 wherein the insulator is formed by reacting the metal film with a reactive gas for a duration of about 2 to 110 seconds.

13. A device as claimed in claim 12 wherein the junction resistance is controlled by varying the insulator in thickness, the thickness of the insulator being controlled by the reaction duration.

14. A device as claimed in claim 1 wherein the insulator is a surface-reacted metal film selected from a group consisting of $Al_2O_3$, AlN, $Si_3N_4$, MgO, $Ta_2O_5$, $TiO_2$, and $Y_2O_3$.

15. A device as claimed in claim 1 wherein the parasitic resistance is greater than the junction resistance so as to render the effective resistance negative.

16. A device as claimed in claim 15 wherein the effective junction resistance is initially negative then changes to become positive when the electromagnetic energy is applied to the junction.

17. A system for diagnosing biological tissue samples comprising:
   a sensor for detecting certain malignant portions of a biological tissue sample pretreated with a chemical coating including a magnetic content which is essentially absorbed by healthy portions of the sample and allows the sensor to distinguish the healthy portions from the malignant portions of the sample, said sensor including a matrix array of trilayer tunnel junction devices, each device comprising:
      a first electrode having a first independent magnetization direction;
      a second electrode having a second independent magnetization direction; and
      an insulator between the first and second electrodes to form a trilayer tunnel junction having an effective junction resistance equal to the difference between the junction resistance and a parasitic resistance contributed by the electrodes near and throughout the junction, wherein the magnetic contact of the sample provides a magnetic field which reverses at least one of the magnetization directions of the first and second electrodes and causes a change in the junction resistance by at least 10% at room temperature with respect to the effective junction resistance; and
   a display station connected to the sensor for receiving image signals from the sensor to display color-coded images of the sample to locate the malignant portions of the sample.

18. A system as claimed in claim 17 wherein the sample is treated with a different chemical coating including a magnetic content which is essentially absorbed by the malignant portions of the sample, and allows the sensor to distinguish the healthy portions from the malignant portions of the sample.

19. A device as claimed in claim 17 wherein the first and second electrodes are ferromagnets.

20. A device as claimed in claim 19 wherein each of the ferromagnets has an electron spin polarization value of about 0.5 or less.

21. A device as claimed in claim 17 wherein the first and second electrodes are half-metal ferromagnets.

22. A device as claimed in claim 21 wherein each of the half-metal ferromagnets has an electron spin polarization value of about 1.0 or less.

23. A device as claimed in claim 17 wherein one of the first and second electrodes is a ferromagnet and the other is a half-metal ferromagnet.

24. A device as claimed in claim 17 wherein the insulator layer ranges from about 2 angstroms to 30 angstroms in thickness.

25. A device as claimed in claim 17 wherein the insulator comprises a metal film selected from a group consisting of Al, Mg, Ta, Ti, Y, and Si.

26. A device as claimed in claim 25 wherein the insulator is formed by reacting the metal film with a reactive gas for a duration of about 2 to 110 seconds.

27. A device as claimed in claim 26 wherein the junction resistance is controlled by varying the insulator in thickness, the thickness of the insulator being controlled by the reacting duration.

28. A device as claimed in claim 17 wherein the insulator is a surface-reacted metal film selected from a group consisting of $Al_2O_3$, AlN, $Si_3N_4$, MgO, $Ta_2O_5$, $TiO_2$, and $Y_2O_3$.

29. A computer storage device comprising:
a magnetic disk for storing binary data; and
a sensor-head for reading the data from the disk comprising:
  a first electrode having a first independent magnetization direction;
  a second electrode having a second independent magnetization direction; and
  an insulator between the first and second electrodes to form a trilayer tunnel junction having an effective junction resistance equal to the difference between the junction resistance and a parasitic resistance contributed by the electrodes near and throughout the junction; and
  an electromagnetic source for applying electromagnetic energy to the junction, said energy reverses at least one of the magnetization directions of the first and second electrodes and causes a change in the junction resistance by at least 10% at room temperature with respect to the effective junction resistance.

30. A device as claimed in claim 29 wherein the first and second electrodes are ferromagnets.

31. A device as claimed in claim 30 wherein each of the ferromagnets has an electron spin polarization value of about 0.5 or less.

32. A device as claimed in claim 29 wherein the first and second electrodes are half-metal ferromagnets.

33. A device as claimed in claim 32 wherein each of the half-metal ferromagnets has an electron spin polarization value of about 1.0 or less.

34. A device as claimed in claim 29 wherein one of the first and second electrodes is a ferromagnet and the other is a half-metal ferromagnet.

35. A device as claimed in claim 29 wherein the insulator layer ranges from about 2 angstroms to 30 angstroms in thickness.

36. A device as claimed in claim 29 wherein the insulator comprises a metal film selected from a group consisting of Al, Mg, Ta, Ti, Y, and Si.

37. A device as claimed in claim 36 wherein the insulator is formed by reacting the metal film with a reactive gas for a duration of about 2 to 110 seconds.

38. A device as claimed in claim 37 wherein the junction resistance is controlled by varying the insulator in thickness, the thickness of the insulator being controlled by the reaction duration.

39. A device as claimed in claim 29 wherein the insulator is a surface-reacted metal film selected from a group consisting of $Al_2O_3$, AlN, $Si_3N_4$, MgO, $Ta_2O_5$, $TiO_2$, and $Y_2O_3$.

40. A method of forming a trilayer tunneling device comprising:
  cooling a substrate in a vacuum;
  overlaying a thin seeding layer onto the substrate;
  depositing a first electrode onto the seeding layer;
  depositing an insulating layer onto the first electrode, the insulating layer having thickness ranging from about 2 angstroms to 30 angstrom; and
  depositing a second electrode onto the insulating layer to form a region in which the first and second electrodes overlap and are separated by the insulating layer, said region providing a tunnel junction.

41. A method as claimed in claim 40 wherein the first and second electrodes and the insulating layer are deposited by radio frequency magnetron sputtering.

42. A method as claimed in claim 40 wherein the first and second electrodes and the insulating layer are deposited by direct current magnetron sputtering.

43. A method as claimed in claim 40 wherein the first and second electrodes and the insulating layer are deposited by ion beam magnetron sputtering.

44. A method as claimed in claim 40 wherein the insulating layer comprises a metal film selected from a group consisting of Al, Mg, Ta, Ti, Y, and Si.

45. A method as claimed in claim 44 wherein the insulating layer is formed by reacting the metal film with a reactive gas for a duration of about 2 to 110 seconds.

46. A method as claimed in claim 45 wherein the metal film is completely reacted by the reactive gas without causing reaction to the first electrode below, and leaving only molecules of the reactive gas as the insulating layer.

47. A method as claimed in claim 45 wherein an upper surface portion of the metal film is reacted with the reactive gas, leaving a lower portion of the metal film in contact with one side of the first electrode below.

48. A method as claimed in claim 44 wherein the first and second electrodes and the metal film of the insulating layer are sputter deposited and the metal film is further reacted with a reactive gas by glow discharge.

49. A method as claimed in claim 44 wherein the first and second electrodes and the metal film of the insulating layer are deposited by evaporation and the metal film is further reacted with a reactive gas by glow discharge.

50. A method as claimed in claim 40 wherein the first and second electrodes are deposited in a presence of an applied magnetic field to improve magnetic field response characteristics of the tunnel junction.

51. A method as claimed in claim 40 wherein the insulating layer is a surface-reacted metal film selected from a group consisting of $Al_2O_3$, AlN, $Si_3N_4$, MgO, $Ta_2O_5$, $TiO_2$, and $Y_2O_3$.

52. A method of detecting and diagnosing malignant portions of a biological tissue comprising:
  pretreating a biological tissue sample with a chemical coating including a magnetic content which is essentially absorbed by healthy portions of the sample so as to distinguish the healthy portions from the malignant portions of the sample;
  placing a sensor over the sample, the sensor including a matrix array of trilayer tunnel junction devices, each device comprising:
    a first electrode having a first independent magnetization direction;
    a second electrode having a second independent magnetization direction; and
    an insulator between the first and second electrodes to form a trilayer tunnel junction having an effective junction resistance equal to the difference between the junction resistance and a parasitic resistance contributed by the electrodes near and throughout the junction;
  allowing the magnetic content from the malignant portions of the sample to apply magnetic field energy to the sensor to cause each junction device to reverse at least one of the magnetization directions of the first and second electrodes and to cause a change in the junction resistance by at least 10% at room temperature with respect to the effective junction resistance; and
  transmitting image signals from the sensor to a display station to display color-coded images of the sample to locate the malignant portions of the sample.

53. A system as claimed in claim 52 wherein the sample is treated with a different chemical coating including a magnetic content which is essentially absorbed by the malignant portions of the sample, and allows the sensor to distinguish the healthy portions from the malignant portions of the sample.

* * * * *